United States Patent
Gosavi et al.

(10) Patent No.: US 11,374,163 B2
(45) Date of Patent: Jun. 28, 2022

(54) SPIN ORBIT MEMORY WITH MULTIFERROIC MATERIAL

(71) Applicant: Intel Corporation, Santa Clara, CA (US)

(72) Inventors: Tanay Gosavi, Hillsboro, OR (US); Chia-Ching Lin, Portland, OR (US); Sasikanth Manipatruni, Portland, OR (US); Dmitri Nikonov, Beaverton, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 773 days.

(21) Appl. No.: 16/012,668

(22) Filed: Jun. 19, 2018

(65) Prior Publication Data

US 2019/0386202 A1     Dec. 19, 2019

(51) Int. Cl.
| | | |
|---|---|---|
| *H01L 43/02* | (2006.01) | |
| *G11C 11/16* | (2006.01) | |
| *H01L 43/10* | (2006.01) | |

(52) U.S. Cl.
CPC ............ *H01L 43/02* (2013.01); *G11C 11/161* (2013.01); *H01L 43/10* (2013.01)

(58) Field of Classification Search
CPC ........ H01L 43/02; H01L 43/10; G11C 11/161
USPC ....................................................... 257/421
See application file for complete search history.

(56) References Cited

U.S. PATENT DOCUMENTS

| | | |
|---|---|---|
| 6,057,049 A | 5/2000 | Fuke et al. |
| 10,283,701 B1 | 5/2019 | Ikhtiar et al. |
| 10,340,445 B2 | 7/2019 | Oguz et al. |
| 10,749,104 B2 | 8/2020 | Liu et al. |
| 10,916,284 B2 | 2/2021 | Le et al. |
| 2004/0125673 A1 | 7/2004 | Daughton et al. |
| 2004/0150017 A1 | 8/2004 | Tsang |
| 2005/0152075 A1 | 7/2005 | Miyazawa et al. |
| 2005/0174836 A1 | 8/2005 | Sharma et al. |
| 2008/0273375 A1 | 11/2008 | Dahmani et al. |
| 2010/0090300 A1 | 4/2010 | Xi et al. |
| 2014/0254256 A1 | 9/2014 | Choi |
| 2015/0008547 A1 | 1/2015 | Pi et al. |
| 2015/0041934 A1 | 2/2015 | Khvalkovskiy et al. |

(Continued)

FOREIGN PATENT DOCUMENTS

| | | |
|---|---|---|
| CN | 105161613 | 12/2015 |
| WO | 2017052606 | 3/2017 |

OTHER PUBLICATIONS

Cubukcu, Murat, et al., "Spin-orbit torque magnetization switching of a three-terminal perpendicular magnetic tunnel junction," Applied Physics Letters 104, 2014, 5 pgs.

(Continued)

*Primary Examiner* — Jami Valentine Miller
(74) *Attorney, Agent, or Firm* — Essential Patents Group, LLP

(57) ABSTRACT

A low power, energy efficient, nonvolatile, high-speed memory apparatus is provided that can function at extremely low temperatures (e.g., less than 30 degree Kelvin). The apparatus includes: a first structure comprising a magnet having free or unpinned magnetization; a second structure comprising Type-II multiferroic material, wherein the second structure is adjacent to the first structure; and an interconnect comprising spin orbit material, wherein the interconnect is adjacent to the first structure.

22 Claims, 9 Drawing Sheets

(56) References Cited

U.S. PATENT DOCUMENTS

| | | |
|---|---|---|
| 2016/0163965 A1 | 6/2016 | Han et al. |
| 2016/0225423 A1 | 8/2016 | Naik et al. |
| 2016/0300612 A1 | 10/2016 | Manipatruni et al. |
| 2017/0069827 A1 | 3/2017 | Lee et al. |
| 2017/0092848 A1 | 3/2017 | Jang et al. |
| 2017/0098760 A1 | 4/2017 | Lin et al. |
| 2017/0178705 A1 | 6/2017 | Buhrman et al. |
| 2018/0061887 A1 | 3/2018 | Braganca |
| 2018/0114898 A1 | 4/2018 | Lee |
| 2018/0129043 A1 | 5/2018 | Kim et al. |
| 2018/0219152 A1 | 8/2018 | Apalkov et al. |
| 2018/0240896 A1 | 8/2018 | Nikonov et al. |
| 2018/0287052 A1* | 10/2018 | Wang ............... G11C 11/18 |
| 2019/0081234 A1 | 3/2019 | Naik et al. |
| 2019/0304525 A1 | 10/2019 | Manipatruni et al. |
| 2019/0304653 A1 | 10/2019 | Oguz et al. |
| 2019/0305212 A1 | 10/2019 | Gosavi et al. |
| 2019/0305216 A1 | 10/2019 | Gosavi et al. |
| 2019/0325931 A1 | 10/2019 | Victora et al. |
| 2019/0385655 A1 | 12/2019 | Lin et al. |
| 2019/0386120 A1 | 12/2019 | Lin et al. |
| 2019/0386205 A1 | 12/2019 | Gosavi et al. |
| 2019/0386208 A1 | 12/2019 | Lin et al. |
| 2019/0386662 A1 | 12/2019 | Lin et al. |
| 2020/0083286 A1 | 3/2020 | Manipatruni et al. |
| 2020/0083427 A1 | 3/2020 | Manipatruni et al. |
| 2020/0098410 A1 | 3/2020 | Gosavi et al. |
| 2020/0161535 A1 | 5/2020 | Lin et al. |
| 2020/0273864 A1 | 8/2020 | Manipatruni et al. |
| 2020/0273866 A1 | 8/2020 | Manipatruni et al. |
| 2020/0273867 A1 | 8/2020 | Manipatruni et al. |
| 2020/0303343 A1 | 9/2020 | Manipatruni et al. |
| 2020/0303344 A1 | 9/2020 | Manipatruni et al. |
| 2020/0321344 A1 | 10/2020 | Ramamoorthy et al. |
| 2020/0321472 A1 | 10/2020 | Ramamoorthy et al. |
| 2020/0321473 A1 | 10/2020 | Ramamoorthy et al. |
| 2020/0321474 A1 | 10/2020 | Ramamoorthy et al. |
| 2020/0402560 A1 | 12/2020 | Thirumala et al. |
| 2021/0202507 A1 | 7/2021 | Thareja et al. |
| 2021/0202510 A1 | 7/2021 | Thareja et al. |
| 2021/0202689 A1 | 7/2021 | Thareja et al. |
| 2021/0202690 A1 | 7/2021 | Thareja et al. |
| 2021/0203324 A1 | 7/2021 | Manipatruni et al. |
| 2021/0203325 A1 | 7/2021 | Manipatruni et al. |
| 2021/0203326 A1 | 7/2021 | Manipatruni et al. |
| 2021/0226636 A1 | 7/2021 | Manipatruni et al. |
| 2021/0343321 A1* | 11/2021 | Wang ............... G11C 11/1675 |

OTHER PUBLICATIONS

Dongwon, L., et al., "Study on Exchange-Biased Perpendicular Magnetic Tunnel Junction Based on Pd/Co Multi layers", IEEE Transactions on Magnetics, IEEE Service Center, New York, NY, US. vol. 45, No. 6, Jun. 1, 2009 (Jun. 1, 2009). pp. 2407-2409, XP011258109, ISSN: 0018-9464, DOI: 10.1109/TMAG.2009.2018590.

Fecioru-Morariu, M., et al., "Effects of Cu Dilution in IrMn on the Exchange Bias of CoFe/IrMn Bilayers", Physical Review Letters, vol. 99, No. 9, Aug. 1, 2007 (Aug. 1, 2007), XP055614810, US. ISSN: 0031-9007, DOI: 10.1103/PhysRevLett.99.097206.

Han, Guchang, et al., "Control of offset field and pinning stability in perpendicular magnetic tunneling junctions with synthetic antiferromagnetic coupling multilayer", Journal of Applied Physics 117, 17B515, 2015, 5 pgs.

Keller, J., et al., "Domain STTE Model for Exchange Bias II. Experiment", Physical Review, B. Condensed Matter, American Institute of Physics. New York, US, vol. 66, No. 1, Jul. 1, 2002 (Jul. 1, 2002), pp. 14431-01, XP001125751, ISSN: 0163-1829, DOI: 10.1103/PHYSREVB.66.014431.

Kiyohara, et al., "Giant Anomalous Hall Effect in the Chiral Antiferromagnet Mn3Ge", arXiv, Jul. 2, 2016, pp. 1-10, XP002793937, DOI: 10.1103/PhysRevApplied.5.064009. Retrieved from the Internet: URL:https://arxiv.org/pdf/1511.04619.pdf [retrieved on Aug. 28, 2019].

Lau, et al., "Spin-orbit torques and spin hall magnetoresistance in antiferromagnetic hexagonal [epsilon] Mn3Ga/CoFeb bilayers", 2017 IEEE International Magnetics Conference (INTERMAG), IEEE, 24, Apr. 2017, p. 1, XP033141017, DOI: 10.1109/INTMAG.2017.8007779.

Lim, et al., "Study on Exchange-Biased Perpendicular Magnetic Tunnel Junction Based on Pd/Co Multilayers", IEEE Transactions on Magnetics, vol. 45, No. 6, Jun. 1, 2009 pp. 2407-2409, XP011258109, IEEE Service Center, New York, NY US ISSN: 0018-9464, DOI: 10.1109/TMAG.2009.2018590.

Misra, A., "Control of exchange bias by diluting the antiferromagnetic layer", Journal of Applied Physics, American Institute of Physics, US, vol. 93, No. 10, May 15, 2003 (May 15, 2003), pp. 6593-6595, XP012057898, ISSN: 0021-8979, DOI: 10.1063/1.1543880.

Niida, et al., "Crystal distortion and weak ferromagnetism of Mn3+[delta] Ga 1-x Ge x alloys", Journal of Applied Physics, vol. 73, No. 10, May 15, 1993 pp. 5692-5694, XP055616327.

Wang, M., et al., "Tunnel Junction with Perpendicular Magnetic Anisotropy: Status and Challenges", Micromachines, vol. 6, No. 8, Aug. 10, 2015 (Aug. 10, 2015), pp. 1023-1045, XP055614473, CH, ISSN: 2072-666X, DOI: 10.3390/mi6081023.

Zelezny, J., et al., "Spin transport and spin torque in antiferromagnetic devices", Nature Physics, Nature Publishing Group, London, GB, vol. 14, No. 3, Mar. 2, 2018 (Mar. 2, 2018), pp. 220-228.

Zhang, et al., "Spin Hall effect emerging from a chiral magnetic lattice without spin-orbit coupling", ARXIV, Apr. 12, 2017, pp. 1-13, XP081145399, Arxiv USA, p. 2, p. 9, line 3-line 14.

* cited by examiner

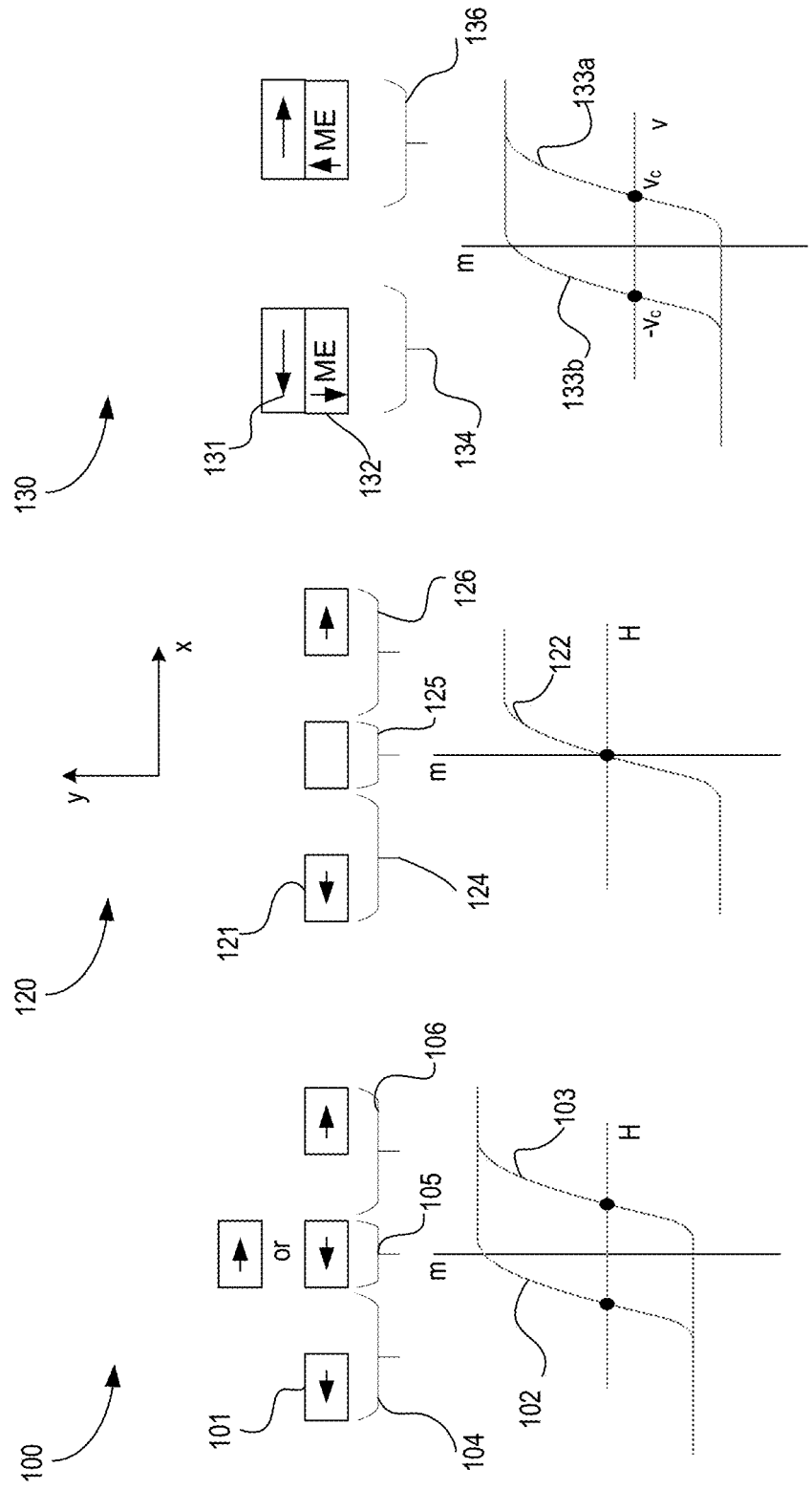

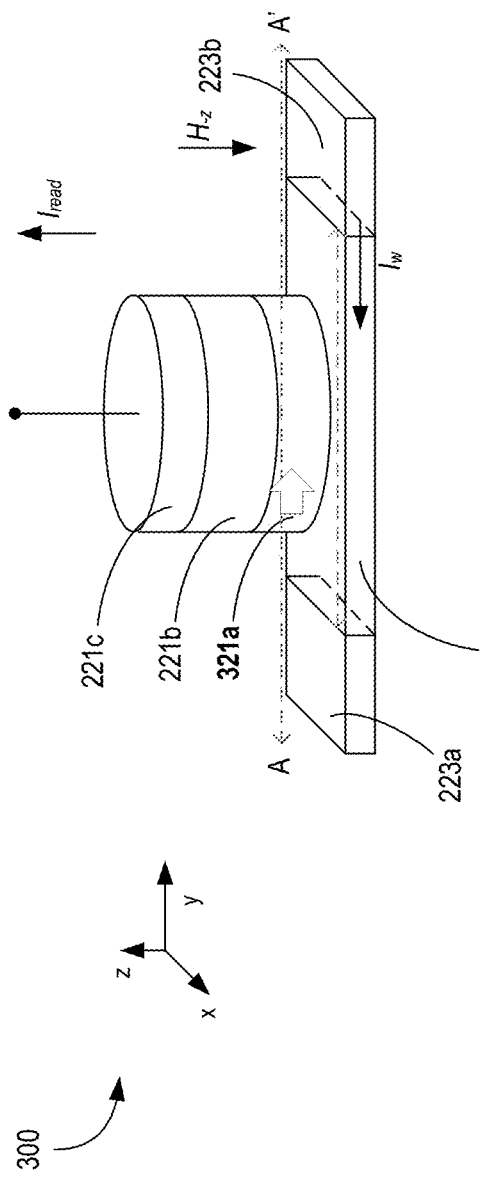
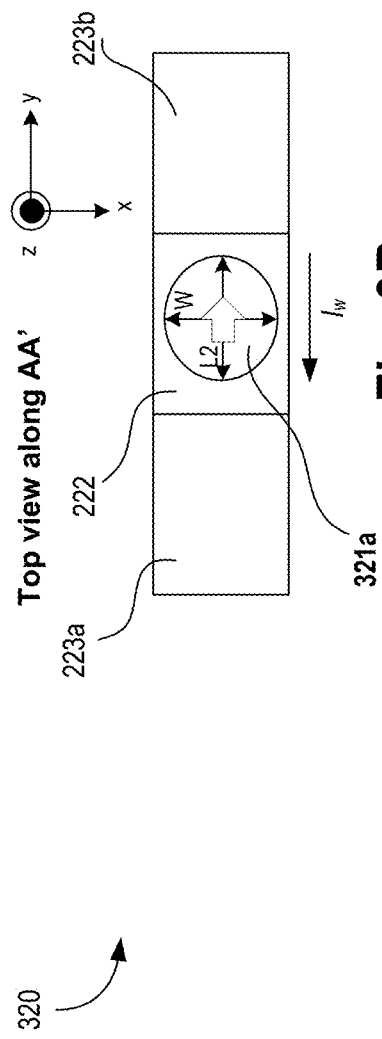

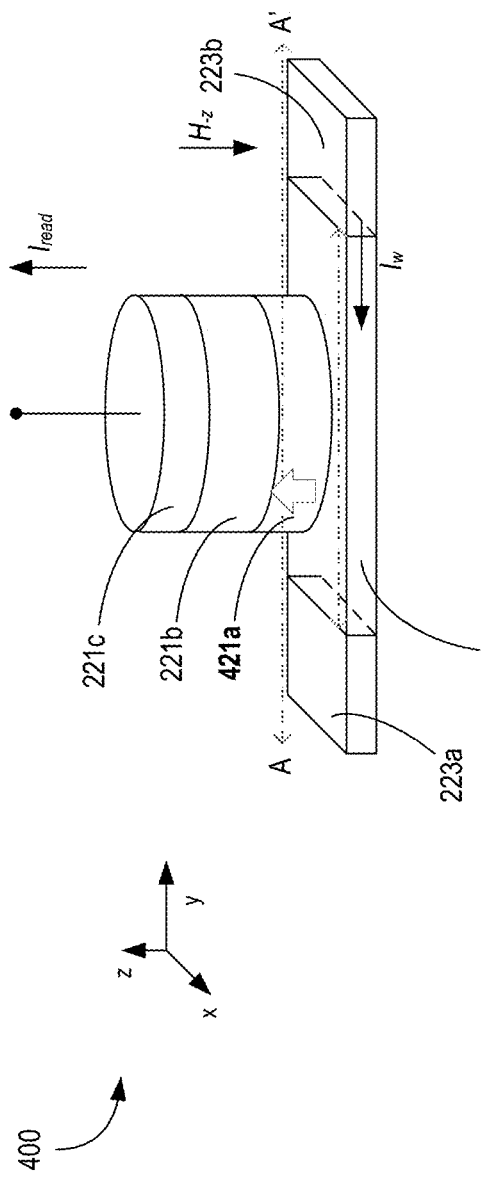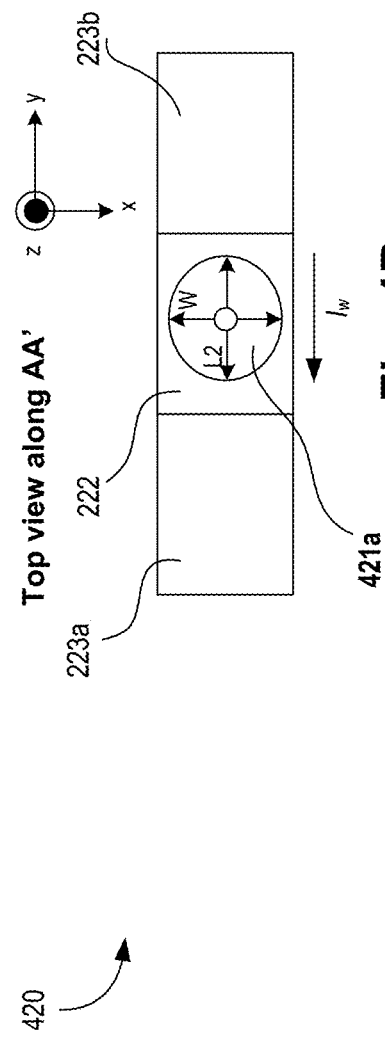

SPIN ORBIT MEMORY WITH MULTIFERROIC MATERIAL

BACKGROUND

Spintronics is the study of intrinsic spin of the electron and its associated magnetic moment in solid-state devices. Spintronic logic are integrated circuit devices that use a physical variable of magnetization or spin as a computation variable. Such variables can be non-volatile (e.g., preserving a computation state when the power to an integrated circuit is switched off). Non-volatile logic can improve the power and computational efficiency by allowing architects to put a processor to un-powered sleep states more often and therefore reduce energy consumption. Existing spintronic logic generally suffer from high energy and relatively long switching times.

For example, large write current (e.g., greater than 100 µA/bit) and voltage (e.g., greater than 0.7 V) are needed to switch a magnet (i.e., to write data to the magnet) in Magnetic Tunnel Junctions (MTJs). Existing Magnetic Random Access Memory (MRAM) based on MTJs also suffer from high write error rates (WERs) or low speed switching. For example, to achieve lower WERs, switching time is slowed down which degrades the performance of the MRAM. MTJ based MRAMs also suffer from reliability issues due to tunneling current in the spin filtering tunneling dielectric of the MTJs e.g., magnesium oxide (MgO).

There is a need for a low power, energy efficient, non-volatile, high-speed memory that can function even at extremely low temperatures (e.g., less than 30 degree Kelvin). Current memory options are based on charging a capacitor using an access transistor or cross coupled transistors connected in a Static Random Access Memory (SRAM) configuration. Both of these memory options need high power. The capacitor option can be nonvolatile in nature but needs a specialized transistor having low leakage to function. The SRAM option is limited by voltage scaling in its operation as well as in its size scaling. Therefore, traditional MRAMs based on MTJs, and traditional SRAMs have challenges providing low power, energy efficient, non-volatile, high-speed memory that can function even at extremely low temperatures.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1A illustrates a magnetization response to applied magnetic field for a ferromagnet.

FIG. 1B illustrates a magnetization response to applied magnetic field for a paramagnet.

FIG. 1C illustrates a magnetization response to applied voltage field for a paramagnet connected to a magnetoelectric layer.

FIGS. 3A-B illustrate a 3D view and corresponding top view, respectively, of a device having multiferroic material and an in-plane magnet coupled to a SOC interconnect, where the in-plane magnetization is co-linear with a direction of current, in accordance with some embodiments.

FIGS. 4A-B illustrate a 3D view and corresponding top view, respectively, of a device having multiferroic material and an out-of-plane magnet coupled to a SOC interconnect.

DETAILED DESCRIPTION

Figure 2A:
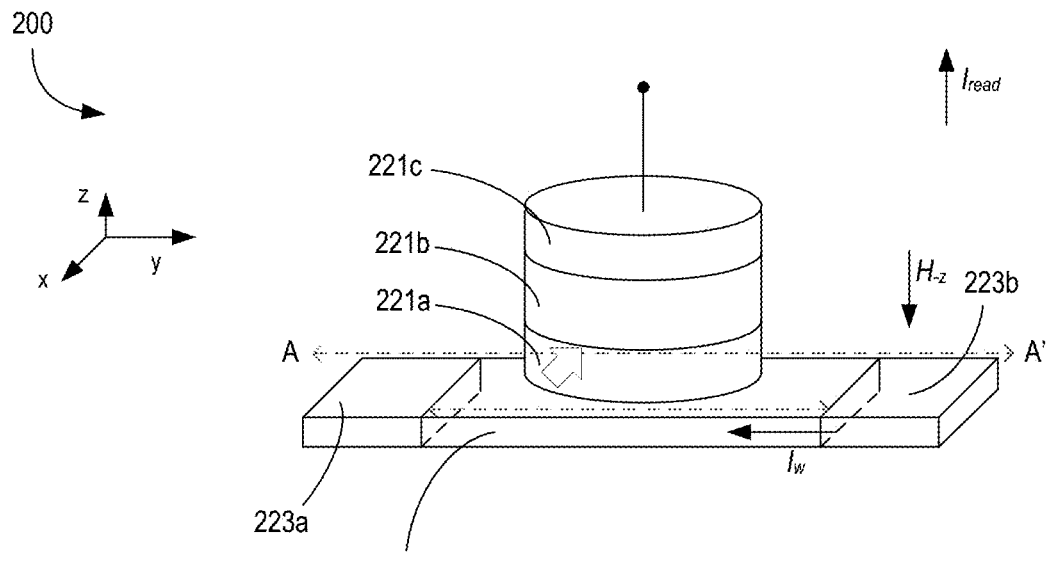
FIGS. 2A-B illustrate a three-dimensional (3D) view and a corresponding top view, respectively, of a device having multiferroic material and an in-plane magnet coupled to a spin orbit coupling (SOC) interconnect, in accordance with some embodiments.

There are some solutions trying to solve the problem of providing low power, energy efficient, nonvolatile, high-speed memory that can function even at extremely low temperatures. Examples of such solutions consist of ferroelectric memory, resistive random access memory (RRAM), Spin Transfer Torque Memory (STTM) and Spin Orbit Torque (SOT) memory. However, these solutions are deficient in one or more performance factors. Of these solutions, STTM and RRAM memory are high power and they are based on passing high current through highly resistive components. Also, STTM and RRAM need very high voltage to function at higher speed. Ferroelectric memory is a promising contender but scaling to low switching voltages is a challenge when trying to overcome depolarization fields. SOT memory is promising too, but the read operation is still based on current through a resistor model and so is the write operation, hence SOT memory is not very power efficient. Another issue with SOT memory is that it is a three terminal memory and hence its density is limited when arrays of SOT bit-cells are arranged.

Some embodiments provide a two-terminal (2T) memory bit-cell that uses multiferroic materials (e.g., Type-II multiferroic materials) as the memory element. In such a two-terminal memory bit-cell, the write electrode comprises a heavy metal, topological insulator or, antiferromagnetic (AFM) material metal having large spin orbit torque or AFM with Neel type Spin orbit torque to switch the magnetization of the multiferroic. In a Type II multiferroic material, the ferroelectric polarization follows the magnetization switching. Switching the magnetization switches the polarization of the ferroelectric. This polarization switch can be sensed by using a capacitance sensor, which forms the read mechanism for the 2T memory bit-cell.

There are many technical effects of the various embodiments. For example, the multiferroic memory is a 2T memory bit-cell and so the bit-cell can be very dense compared to SRAM, RRAM, MRAM, STTM, and/or SOT memory bit-cells. The multiferroic effect is the lowest energy switching transition that is accessible. This makes the memory of various embodiments to be a very low power one. The read and write operations are decoupled due to ferroelectric vs. ferromagnetic characteristics, hence, the chance of read disturb which is an issue for ferroelectric memory is very small. In some embodiments, Neel SOT or topological insulators are used for applying torque to the Type-II multiferroic material. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "free" or "unfixed" here with reference to a magnet refers to a magnet whose magnetization direction can change along its easy axis upon application of an external field or force (e.g., Oersted field, spin torque, etc.). Conversely, the term "fixed" or "pinned" here with reference to a magnet refers to a magnet whose magnetization direction is pinned or fixed along an axis and which may not change due to application of an external field (e.g., electrical field, Oersted field, spin torque).

Here, perpendicularly magnetized magnet (or perpendicular magnet, or magnet with perpendicular magnetic anisotropy (PMA)) refers to a magnet having a magnetization which is substantially perpendicular to a plane of the magnet or a device. For example, a magnet with a magnetization which is in a z-direction in a range of 90 (or 270) degrees+/−20 degrees relative to an x-y plane of a device.

Here, an in-plane magnet refers to a magnet that has magnetization in a direction substantially along the plane of the magnet. For example, a magnet with a magnetization which is in an x or y direction and is in a range of 0 (or 180 degrees)+/−20 degrees relative to an x-y plane of a device.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z-direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single finFET.

For the purposes of present disclosure, the terms "spin" and "magnetic moment" are used equivalently. More rigorously, the direction of the spin is opposite to that of the magnetic moment, and the charge of the particle is negative (such as in the case of electron).

It is pointed out that those elements of the figures having the same reference numbers (or names) as the elements of any other figure can operate or function in any manner similar to that described but are not limited to such.

FIG. 1A illustrates a magnetization hysteresis plot 100 for ferromagnet (FM) 101. The plot shows magnetization response to an applied magnetic field for ferromagnet 101. The x-axis of plot 100 is magnetic field 'H' while the y-axis is magnetization 'm'. For FM 101, the relationship between 'H' and 'm' is not linear and results in a hysteresis loop as shown by curves 102 and 103. The maximum and minimum magnetic field regions of the hysteresis loop correspond to saturated magnetization configurations 104 and 106, respectively. In saturated magnetization configurations 104 and 106, FM 101 has stable magnetization. In the zero magnetic field region 105 of the hysteresis loop, FM 101 does not have a definite value of magnetization, but rather depends on the history of applied magnetic fields. For example, the magnetization of FM 101 in configuration 106 can be either in the +x direction or the −x direction for an in-plane FM. As such, changing or switching the state of FM 101 from one magnetization direction (e.g., configuration 104) to another magnetization direction (e.g., configuration 106) is time consuming resulting in slower nanomagnets response time. It is associated with the intrinsic energy of switching proportional to the area in the graph contained between curves 102 and 103.

In some embodiments, FM 101 is formed of CFGG (i.e., Cobalt (Co), Iron (Fe), Germanium (Ge), or Gallium (Ga) or a combination of them). In some embodiments, FM 101 comprises one or more of Co, Fe, Ni alloys and multilayer hetero-structures, various oxide ferromagnets, garnets, or Heusler alloys. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu.

FIG. 1B illustrates magnetization plot 120 for paramagnet 121. Plot 120 shows the magnetization response to an applied magnetic field for paramagnet 121. The x-axis of plot 120 is magnetic field 'H' while the y-axis is magnetization 'm'. A paramagnet, as opposed to a ferromagnet, exhibits magnetization when a magnetic field is applied to it. Paramagnets generally have magnetic permeability greater or equal to one and hence are attracted to magnetic fields. Compared to plot 100, the magnetic plot 120 of FIG. 1B does not exhibit hysteresis which allows for faster switching speeds and smaller switching energies between the two saturated magnetization configurations 124 and 126 of curve 122. In the middle region 125, paramagnet 121 does not have any magnetization because there is no applied magnetic field (e.g., H=0). The intrinsic energy associated with switching is absent in this case.

In some embodiments, paramagnet 121 comprises a material which includes one or more of: Platinum (Pt), Palladium (Pd), Tungsten (W), Cerium (Ce), Aluminum (Al), Lithium (Li), Magnesium (Mg), Sodium (Na), $Cr_2O_3$ (chromium oxide), CoO (cobalt oxide), Dysprosium (Dy), $Dy_2O$ (dysprosium oxide), Erbium (Er), $Er_2O_3$ (Erbium oxide), Europium (Eu), $Eu_2O_3$ (Europium oxide), Gadolinium (Gd), Gadolinium oxide ($Gd_2O_3$), FeO and $Fe_2O_3$ (Iron oxide), Neodymium (Nd), $Nd_2O_3$ (Neodymium oxide), $KO_2$ (potassium superoxide), praseodymium (Pr), Samarium (Sm), $Sm_2O_3$ (samarium oxide), Terbium (Tb), $Tb_2O_3$ (Terbium oxide), Thulium (Tm), $Tm_2O_3$ (Thulium oxide), or $V_2O_3$ (Vanadium oxide). In some embodiments, paramagnet 121 comprises dopants which include one or more of: Ce, Cr, Mn, Nb, Mo, Tc, Re, Nd, Gd, Tb, Dy, Ho, Er, Tm, or Yb. In various embodiments, the magnet can be either a FM or a paramagnet.

FIG. 1C illustrates plot 130 showing magnetization response to applied voltage field for a paramagnet 131 connected to a magnetoelectric layer 132. Here, the x-axis is voltage 'V' applied across ME layer 132 and y-axis is magnetization 'm'. Ferroelectric polarization "$P_{FE}$" in ME layer 132 is indicated by an arrow. In this example, magnetization is driven by exchange bias exerted by a ME effect from ME layer 132. When positive voltage is applied to ME layer 132, paramagnet 131 establishes a deterministic magnetization (e.g., in the +x direction by voltage $+V_c$) as shown by configuration 136. When negative voltage is applied by ME layer 132, paramagnet 131 establishes a deterministic magnetization (e.g., in the −x direction by voltage $-V_c$) as shown by configuration 134. Plot 130 shows that magnetization functions 133a and 133b have hysteresis. In some embodiments, by combining ME layer 132 with paramagnet 131, switching speeds of paramagnet as shown in FIG. 1B are achieved. In some embodiments, the hysteresis behavior of magnet 131, as shown in FIG. 1C, is associated with the driving force of switching rather than the intrinsic resistance of the magnet to switching. In some embodiments, the paramagnet 131 can be replaced with a ferromagnet such as FM 101.

Figure 2B:
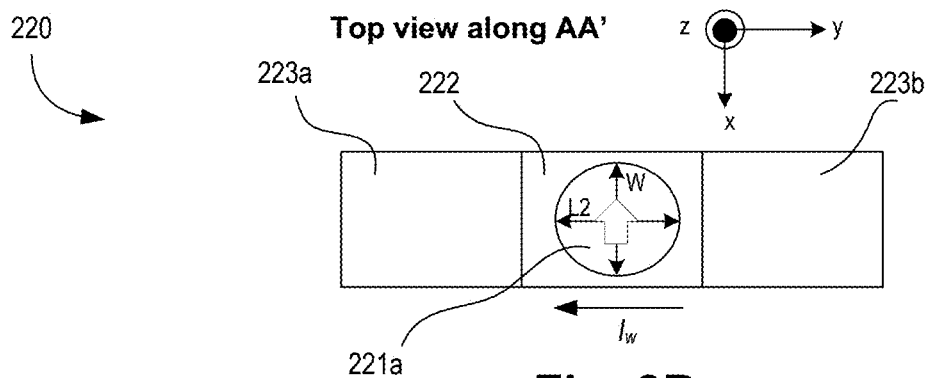

FIGS. 2A-B illustrate a three-dimensional (3D) view 200 and corresponding top view 220, respectively, of a device having a Type-II multiferroic material and an in-plane magnet coupled to a spin orbit coupling (SOC) interconnect, in accordance with some embodiments.

Here, memory device of FIG. 2A comprises stack of layers including a free magnet 221a, multiferroic material 221b, and conductor 221c; and a write electrode 222 coupled to non-magnetic conducting metals 223a/b. The write electrode comprises spin Hall effect (SHE) or SOC material (or spin orbit torque (SOT) material), where the SHE material converts charge current $I_W$ (or write current) to spin polarized current $I_S$.

The device of FIG. 2A forms a two-terminal device with SHE induced write mechanism that forms the first terminal and capacitance/voltage based read-out which forms the second terminal. In this example, one of nodes 223a/b is the first terminal while electrode 221c is coupled to the second terminal. Spin Hall effect is a relativistic spin-orbit coupling phenomenon that can be used to electrically generate or detect spin currents in non-magnetic systems.

When an in-plane current $I_W$ is applied to heavy-metal/magnet bilayer systems, this in-plane current gives rise to spin accumulation in the magnet 221a via spin-orbit interactions. The spin accumulation in the free magnet 221a leads to torques (e.g., SOT) or effective fields acting on the magnetization, thus switching the magnetization of the free ferromagnet. The SOT has two components with different symmetries—Slonczewski-like torque and field-like torque. The origin of the SOT is generally attributed to the bulk spin Hall effect in the heavy metal. The specific structures of the SOT switching scheme demonstrated here are categorized into two types according to the direction of the easy axis of the ferromagnet.

In some embodiments, the free magnet 221a is a ferromagnet (FM) that is formed of CFGG (i.e., Cobalt (Co), Iron (Fe), Germanium (Ge), or Gallium (Ga) or a combination of them). In some embodiments, FM 221a is formed from Heusler alloys. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu.

The thickness of a ferromagnetic layer (e.g., fixed or free magnetic layer) may determine its equilibrium magnetization direction. For example, when the thickness of the ferromagnetic layer 221a is above a certain threshold (depending on the material of the magnet, e.g. approximately 1.5 nm for CoFe), then the ferromagnetic layer exhibits magnetization direction which is in-plane. Likewise, when the thickness of the ferromagnetic layer 221a is below a certain threshold (depending on the material of the magnet), then the ferromagnetic layer 221a exhibits magnetization direction which is perpendicular to the plane of the magnetic layer as illustrated with reference to FIGS. 4A-B.

Other factors may also determine the direction of magnetization. For example, factors such as surface anisotropy (depending on the adjacent layers or a multi-layer composition of the ferromagnetic layer) and/or crystalline anisotropy (depending on stress and the crystal lattice structure modification such as FCC (face centered cubic lattice), BCC (body centered cubic lattice), or $L1_0$-type of crystals, where $L1_0$ is a type of crystal class which exhibits perpendicular magnetization), can also determine the direction of magnetization.

In some embodiments, magnet 221a comprises a paramagnet. In some embodiments, paramagnet 221a comprises a material which includes one or more of: Platinum (Pt), Palladium (Pd), Tungsten (W), Cerium (Ce), Aluminum (Al), Lithium (Li), Magnesium (Mg), Sodium (Na), $Cr_2O_3$ (chromium oxide), CoO (cobalt oxide), Dysprosium (Dy), $Dy_2O$ (dysprosium oxide), Erbium (Er), $Er_2O_3$ (Erbium oxide), Europium (Eu), $Eu_2O_3$ (Europium oxide), Gadolinium (Gd), Gadolinium oxide ($Gd_2O_3$), FeO and $Fe_2O_3$ (Iron oxide), Neodymium (Nd), $Nd_2O_3$ (Neodymium oxide), $KO_2$ (potassium superoxide), praseodymium (Pr), Samarium (Sm), $Sm_2O_3$ (samarium oxide), Terbium (Tb), $Tb_2O_3$ (Terbium oxide), Thulium (Tm), $Tm_2O_3$ (Thulium oxide), or $V_2O_3$ (Vanadium oxide). In some embodiments, paramagnet 121 comprises dopants which include one or more of: Ce, Cr, Mn, Nb, Mo, Tc, Re, Nd, Gd, Tb, Dy, Ho, Er, Tm, or Yb.

In some embodiments, free magnets 221a comprises a composite stack of multi-layers. In some embodiments, the multiplayers includes 'n' layers of a first material and a second material. For example, the composite stack comprises layers of first and second materials stacked in an alternating manner along the z-direction, where 'n' has a range of 1 to 10. In some embodiments, the first material includes one of: Co, Ni, Fe, or a Heusler alloy. In some embodiments, the second material includes one of: Pt, Pd, Ir, Ru, or Ni. In some embodiments, the first material has a thickness t1 (along the z-direction) in a range of 0.6 nm to 2 nm. In some embodiments, the second material has a thickness t2 (along the z-direction) in a range of 0.1 nm to 3 nm.

Referring back to FIG. 2A, in some embodiments, the multiferroic material of structure 221b is a Type-II multiferroic material. In some embodiments, the multiferroic material comprises one or more of: one or more of: Tb, Mn, Ni, V, W, Ca, Co, Rb, Fe, Mo, Cu, Ag, Li, Na, or rare earth metal. In some embodiments, Type-II multiferroic material comprises: $TbMn_2O_5$, $TbMnO_3$, $Ni_3V_2O_6$, $MnWO_4$, $Ca_3CoMnO_6$, $RbFe(MoO_4)_3$, $CuFeO_2$ and $ACrO_2$ where A=Cu, Ag, Li, Na; $RMnO_3$, where R is any rare earth metal; and $RMnO_5$, where R is any rare earth metal.

Figure 6A:
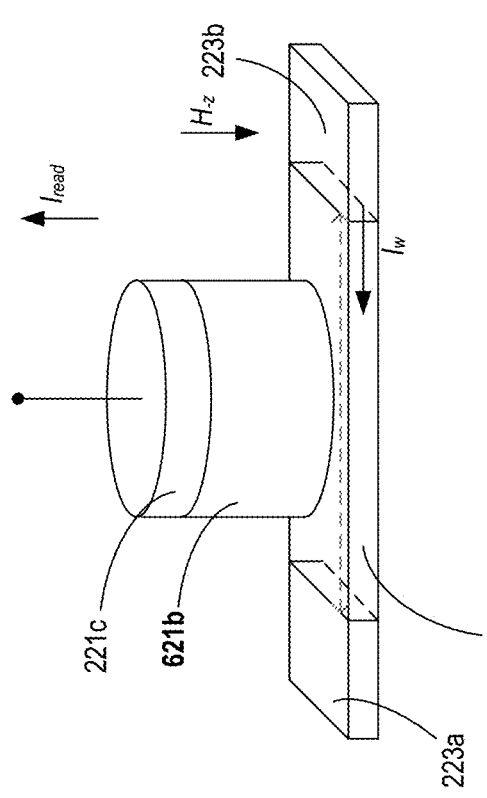
FIG. 6A-B illustrate a 3D view and a corresponding top view, respectively, of a device having multiferroic material directly coupled to a SOC interconnect, in accordance with some embodiments.

In Type II multiferroic material 221b, magnetism is the primary order parameter while the ferroelectricity follows magnetism. For writing to the memory bit-cell, in some embodiments, the SOT layer 222 is directly coupled to multiferroic 221b or indirectly coupled via a magnetic material 221a. The coupling here can be antiferromagnetic, ferromagnetic or dipole between the magnetic material and the multiferroic. In some embodiments, the magnetic material for 221a can be paramagnetic, ferromagnetic or ferrimagnetic. In some embodiments, the SOC electrode 222 can be directly coupled to the multiferroic without the interfacing layer. In one such case, the spin orbit torque generated by the applying current in the multiferroic switches the magnetization, as illustrated by FIG. 6A.

Referring back to FIG. 2A, when using a magnetic material 221a between SOC 222 and multiferroic 221b, the magnetic materials 221a switches and this causes the magnetization of the SOC layer 222 to switch due to exchange coupling and/or exchange bias at the interface of the SOC layer 22 and the magnetic material 221a. The magnetization switching in Type II multiferroic causes the ferroelectric or the anti-ferroelectric polarization to switch along with it. The switching of the polarization of the multiferroic is read as change in the capacitance across the capacitor formed between structures 221c and 221a. This capacitance can be sensed using a typical Dynamic Random Access Memory (DRAM) sense amplifier circuit, in accordance with some embodiments.

In some embodiments, SHE interconnect 222 (or the write electrode) includes 3D materials such as one or more of β-Tantalum (β-Ta), Ta, β-Tungsten (β-W), W, Pt, Copper (Cu) doped with elements such as Iridium, Bismuth and any of the elements of 3d, 4d, 5d and 4f, 5f periodic groups in the Periodic Table which may exhibit high spin orbit coupling. In some embodiments, SHE Interconnect 222 transitions into high conductivity non-magnetic metal(s) 223a/b to reduce the resistance of SHE Interconnect 222. The non-magnetic metal(s) 223a/b include one or more of: Cu, Co, α-Ta, Al, CuSi, NiSi, graphene, etc.

In some embodiments, SOT interconnect 222 comprises a spin orbit 2D material which includes one or more of: graphene, $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$. In some embodiments, the SOT interconnect 222 comprises spin orbit material which includes one of a 2D material or a 3D material, wherein the 3D material is thinner than the 2D material. In some embodiments, the SHE interconnect 222 comprises a spin orbit material which includes materials that exhibit Rashba-Bychkov effect.

In some embodiments, the 2D materials include one or more of: Mo, S, W, Se, Graphene, $MoS_2$, $WSe_2$, $WS_2$, or $MoSe_2$. In some embodiments, the 2D materials include an absorbent which includes one or more of: Cu, Ag, Pt, Bi, Fr, or H absorbents. In some embodiments, the SOC structures comprise a spin orbit material which includes materials that exhibit Rashba-Bychkov effect. In some embodiments, material which includes materials that exhibit Rashba-Bychkov effect comprises materials $ROCh_2$, where 'R' includes one or more of: La, Ce, Pr, Nd, Sr, Sc, Ga, Al, or In, and where "Ch" is a chalcogenide which includes one or more of: S, Se, or Te.

In some embodiments, SOC interconnect 222 comprises a lattice structure of a chiral AFM (antiferromagnetic) material $Mn_3Sn$. The chiral AFM based SOC electrode 222 further improves the efficiency of switching the free magnet 221a of the magnetic memory device. The chiral antiferromagnetic state of various embodiments has a very weak and soft ferromagnetic moment of about 0.002 Bohr magnetons per Mn atom, allowing switching the sign of the Hall effect with a small magnetic field of around a few hundred Oersted.

One benefit of the chiral ordering of the spins in the chiral AFM based SOC electrode 222 is that the use of traditional assist current needed to cause the SOC electrode 222 attached to the free magnet 221a to switch, may no longer be needed. As such, low power and efficiency switching of the free magnet 221a is achieved using AFM materials for the SOC electrode.

In some embodiments, the free magnet 221a is a structure which comprises at least two free magnets with a coupling layer between them, where one of the free magnet couples to (or is adjacent to) chiral AFM based SOC electrode 222 or regular SOC electrode 222. In some embodiments, the coupling layer includes one or more of: Ru, Os, Hs, Fe, or other transition metals from the platinum group of the periodic table.

In some embodiments, chiral AFM based SOC electrode 222 comprises chiral AFM such as $Mn_3X$ class of materials, where 'X' is one of Ge, Sn, Ga, Ir, Rh, or Pt. The $Mn_3X$ materials exhibit a non-collinear AFM order which, to avoid geometrical frustration, forms planes of Mn moments that are arranged in a Kagome-type lattice. With respect to these Kagome planes, in some embodiments, both the anomalous Hall conductivity (AHC) and the spin Hall conductivity (SHC) are quite anisotropic for any of these materials.

In some embodiments, chiral AFM based SOC electrode 222 is a Kagomi Chiral AFM. Examples of materials for Kagomi Chiral AFM include materials such as $Mn_3Sn$. Other examples include class-1 S-1/2 Kagomi AFMs, class-2 S-1/2 hyper Kagomi AFMs, and Metallo-organics. Class-1 S-1/2 Kagomi AFM includes material such as: $Cs_2Cu_3MF_{12}$, $Rb_2Cu_3SnF_{12}$, and $X_2Cu_3MF_{12}$, where M=Zr, Hf, or Sn. Class-2 S-1/2 hyper Kagomi AFM includes material such as: $Na_4Ir_3O_8$, $CuFeO_2$, $NaFeO_2$, $MnBr_2$, $SrCr_xFa_{12-x}O_{19}$, where 'x' is a number. Metallo-organics includes material such as: $Na_2Ba_3[Fe_3^{II}(C_2O_4)_6][A^{IV}(C_2O_4)_3]$, where $A^{IV}$ is one of $Sn^{IV}$ or $Zr^{IV}$, and $Na_2Ba_3[Fe_3^{II}(C_2O_4)_6][A^{III}(C_2O_4)_3]_{0.5}[A^{III}(C_2O_4)_3]_2 \times (H_2O)_2]_{0.5}$, where $A^{III}$ is one of $Fe^{III}$ or $Al^{III}$. In some embodiments, the Kagomi Chiral AFM material has a thickness tSOC (along the z-direction) in a range of 1 nm to 25 nm. In various embodiments, Chiral AFM based SOC electrode 222 applies SOT directly to the free layer 221a.

In some embodiments, the AFM material for SOC electrode 222 is a quasi-two-dimensional triangular AFM including $Ni_{(1-x)}M_xGa_2S_4$, where 'M' includes one of: Mn, Fe, Co or Zn and transition metal di-chalcogenides/topological insulators like $BiSe_2$, $WTe_2$, $WSe_2$, $MoSe_2$ etc.

In some embodiments, the AFM material for SOC electrode 222 is an AFM material doped with a doping material. In some embodiments, the doping material includes one of: Co, Fe, Ni, Mn, Ga, Fe, or Bct-Ru. Antiferromagnetic or doping materials can be: IrMn, PtMn, NiMn or other triangular, Kagomi, chiral or hexagonal antiferromagnetic material and in their single crystal form or their amorphous alloys in various compositions. The doping can be done by co-sputtering and or reactive ion sputtering in case of oxygen or nitrogen. The oxygen, fluorine doping can be done by plasma treatments. In some embodiments, the AFM for the SOC electrode 222 comprises Neel spin orbit material.

In FIG. 2A, the switching layer 221a has its easy axis along the plane (e.g., x plane) direction. For this type, an external field along the z-axis, Hz, is applied to break the symmetry and achieve bipolar switching. Assuming that the driving force for switching originates from the spin Hall effect in interconnect 222, the critical current density $J_c$ is given by:

$$J_c = \frac{2e}{\hbar} \frac{\alpha M_s t_F}{\theta_{SH}^{eff}} \left( H_{K,in}^{eff} + \frac{H_{K,out}^{eff}}{2} \right)$$

where α is the Gilbert damping constant, e is the elementary charge, h is the Dirac contact, $\theta_{SH}^{eff}$ is the effective spin Hall angle, $M_s$ is the saturation magnetization, $t_F$ is the thickness of the magnet layer 221a along the z-direction, $H_{K,in}^{eff}$ is in-plane effective anisotropy field, and $H_{K,out}^{eff}$ is the out-of-plane effective anisotropy field of the magnet layer 221a.

In this example, the applied current $I_w$ is converted into spin current $I_s$ by SHE Interconnect 222 (also referred to as the spin orbit coupling interconnect). This spin current switches the direction of magnetization of the free layer and thus changes the charge polarity of the Type-II multiferroic material 221b. However, to read out the state of memory device, a sensing mechanism is needed to sense the charge polarity change.

The magnetic cell is written by applying a charge current via SHE Interconnect 222. The direction of the magnetic writing in free magnet layer 221a is decided by the direction of the applied charge current. Positive currents (e.g., currents flowing in the +y direction) produce a spin injection current with transport direction (along the +z direction) and spins pointing to the +x direction. The injected spin current in turn produces spin torque to align the free magnet 221a (coupled to the SHE layer 222 of SHE material) in the +x direction. Negative currents (e.g., currents flowing in the −y direction) produce a spin injection current with transport direction (along the +z direction) and spins pointing to the −x direction. The injected spin current in-turn produces spin torque to align the free magnet 221a (coupled to the SHE material of layer 222) in the −x direction. In some embodiments, in materials with the opposite sign of the SHE/SOC effect, the directions of spin polarization and thus of the free layer magnetization alignment are reversed compared to the above.

Figure 2C:
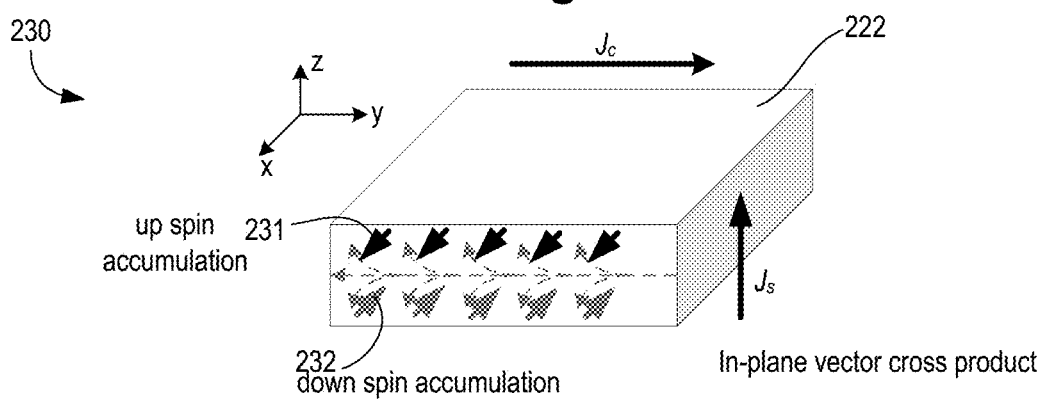
FIG. 2C illustrates a cross-section of the SOC interconnect with electrons having their spins polarized in-plane and deflected up and down resulting from a flow of charge current.

FIG. 2C illustrates a cross-section of the SOC interconnect with electrons having their spins polarized in-plane and deflected up and down resulting from a flow of charge current. In this example, positive charge current represented by $J_c$ produces spin-front (e.g., in the +x direction) polarized current 231 and spin-back (e.g., in the −x direction) polarized current 232. The injected spin current $\vec{I}_s$ generated by a charge current $\vec{I}_c$ in the write electrode 222 is given by:

$$\vec{I}_s = P_{SHE}(w, t, \lambda_{sf}, \theta_{SHE})(\vec{I}_c \times \hat{z}) \quad (1)$$

where, the vector of spin current $\hat{I}_s = \vec{I}_\uparrow - \vec{I}_\downarrow$ points in the direction of transferred magnetic moment and has the magnitude of the difference of currents with spin along and opposite to the spin polarization direction, $\hat{z}$ is the unit vector perpendicular to the interface, $P_{SHE}$ is the spin Hall injection efficiency which is the ratio of magnitude of transverse spin current to lateral charge current, w is the width of the magnet, t is the thickness of the SHE Interconnect (or write electrode) 222, $\lambda_{sf}$ is the spin flip length in SHE Interconnect 222, $\theta_{SHE}$ is the spin Hall angle for SHE Interconnect 222 to free ferromagnetic layer interface. The injected spin angular momentum per unit time responsible for the spin torque is given by:

$$\vec{S} = \hbar \vec{I}_s / 2e \quad (2)$$

The generated spin up and down currents 231/232 are equivalent to the spin polarized current per unit area (e.g., $\vec{J}_s$) given by:

$$\vec{J}_s = \theta_{SHE}(\vec{J}_c \times \hat{z}) \quad (3)$$

The direction of magnetization of free magnet 221a determines the charge polarity of Type-II multiferroic material 221b. The charge polarity indicates the state of the logic stored in the memory device. As such, multiferroic material 221b forms a capacitive structure having capacitance given as:

$$C = \frac{\varepsilon \varepsilon_0 A}{t_{ME}} \approx 1 fF$$

In some embodiments, the multiferroic material is a typical multiferroic which comprises BFO (e.g., $BiFeO_3$), LFO ($LuFeO_2$, $LuFe_2O_4$), or La doped $BiFeO_3$. In some embodiments, the multiferroic material includes one of: Bi, Fe, O, Lu, or La. In some embodiments, multiferroic material 221b comprises one of dielectric material, para-electric material or ferro-electric material.

In some embodiments, the dielectric material includes one of: $HfO_2$, $SiO_2$, $HfZrO_2$, $Al_2O_3$, $SrTiO_3$, $LaSrMoO_3$, or their super lattices. For example, dielectric material may have super lattice of any of two or more layers of material in an alternating fashion, where the layers of material include layers of: $HfO_2$, $SiO_2$, $HfZrO_2$, $Al_2O_3$, $SrTiO_3$, or $LaSrMoO_3$. In some embodiments, the dielectric material includes one of the following elements: Hf, O, Si, Zr, Al, Sr, Ti, La, or Mo. In some embodiments, the para-electric material includes one of: $Cr_2O_3$, doped $HfZrO_3$. In some embodiments, the para-electric material includes one of the following elements: Cr, O, Hf, or Zr. In some embodiments, the ferroelectric material includes one of: $BiFeO_3$, $SrTiO_3$, $LaAlO_3$, $HfZrO_3$, or $HfSiO_3$. In some embodiments, the ferroelectric material includes one of the following elements: Bi, Fe, O, Sr, Ti, La, Al, Hf, Zr, or Si.

FIGS. 3A-B illustrate a 3D view 300 and corresponding top view 320, respectively, of a device having multiferroic material (e.g., Type-II multiferroic material) and an in-plane magnet coupled to a SOC interconnect, where the in-plane magnetization is co-linear with a direction of current, in accordance with some embodiments. Compared to the device of FIGS. 2A-B, here, switching layer 321a has easy axis in the film plane (e.g., y plane) and collinear with the current along the y-axis. The fixed magnet 321c also has magnetization along the y-plane. Material wise, magnet 321a is the same as magnet 221a, but with different magnetic orientation along the same plane. In some embodiments, the easy axis is parallel to the current flowing along the y axis. With the application of an external magnetic field, Hz, along the z direction, bipolar switching is achieved.

FIGS. 4A-B illustrate a 3D view 400 and corresponding top view 420, respectively, of a device having multiferroic material (e.g., Type-II multiferroic material) and an out-of-plane magnet coupled to a SOC interconnect. Compared to the embodiments of FIGS. 2-3, here free magnet layer (or structure) 421a, has perpendicular magnetic anisotropy (PMA). For example, fixed magnet structure 421a has a magnetization pointing along the z-direction and is perpendicular to the x-y plane of the device 400. Likewise, fixed magnet structure 421a has a magnetization pointing along the z-direction and is perpendicular to the x-y plane of the device 400.

In some embodiments, the magnets with PMA comprise a stack of materials, wherein the materials for the stack are selected from a group consisting of: Co and Pt; Co and Pd; Co and Ni; MgO, CoFeB, Ta, CoFeB, and MgO; MgO, CoFeB, W, CoFeB, and MgO; MgO, CoFeB, V, CoFeB, and MgO; MgO, CoFeB, Mo, CoFeB, and MgO; $Mn_xGa_y$; Materials with $L1_0$ symmetry; and materials with tetragonal crystal structure. In some embodiments, the magnet with PMA is formed of a single layer of one or more materials. In some embodiments, the single layer is formed of MnGa.

$L1_0$ is a crystallographic derivative structure of a FCC (face centered cubic lattice) structure and has two of the faces occupied by one type of atom and the corner and the other face occupied with the second type of atom. When phases with the L1$_0$ structure are ferromagnetic the magnetization vector usually is along the [0 0 1] axis of the crystal. Examples of materials with L1$_0$ symmetry include CoPt and FePt. Examples of materials with tetragonal crystal structure and magnetic moment are Heusler alloys such as CoFeAl, MnGe, MnGeGa, and MnGa.

In some embodiments, the free magnetic layer 421a is an FM that is formed of CFGG. In some embodiments, FM 421a is formed from Heusler alloys. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions. In some embodiments, the Heusler alloy includes one of: Cu$_2$MnAl, Cu$_2$MnIn, Cu$_2$MnSn, Ni$_2$MnAl, Ni$_2$MnIn, Ni$_2$MnSn, Ni$_2$MnSb, Ni$_2$MnGa Co$_2$MnAl, Co$_2$MnSi, Co$_2$MnGa, Co$_2$MnGe, Pd$_2$MnAl, Pd$_2$MnIn, Pd$_2$MnSn, Pd$_2$MnSb, Co$_2$FeSi, Co$_2$FeAl, Fe$_2$VAl, Mn$_2$VGa, Co$_2$FeGe, MnGa, or MnGaRu.

In FIG. 4A, the switching layer 421a has its easy axis along the out-of-plane (z) direction. For this type, an external field along the y-axis, H$_y$, is applied to break the symmetry and achieve bipolar switching. Assuming that the driving force for switching originates from the spin Hall effect in interconnect 222, the critical current density J$_C$ is given by:

$$J_c = \frac{2e}{\hbar} \frac{M_s t_F}{\theta_{SH}^{eff}} \left( \frac{H_K^{eff}}{2} - \frac{H_y}{\sqrt{2}} \right)$$

where e is the elementary charge, h is the Dirac contact, $\theta_{SH}^{eff}$ is the effective spin Hall angle, and M$_s$, t$_F$, and H$_K^{eff}$ are the saturation magnetization, thickness and effective anisotropy field of the ferromagnet layer 321a, respectively.

In some embodiments, SHE interconnect 222 comprises a spin orbit 2D material which includes one or more of: graphene, TiS$_2$, WS$_2$, MoS$_2$, TiSe$_2$, WSe$_2$, MoSe$_2$, B$_2$S$_3$, Sb$_2$S$_3$, Ta$_2$S, Re$_2$S$_7$, LaCPS$_2$, LaOAsS$_2$, ScOBiS$_2$, GaOBiS$_2$, AlOBiS$_2$, LaOSbS$_2$, BiOBiS$_2$, YOBiS$_2$, InOBiS$_2$, LaOBiSe$_2$, TiOBiS$_2$, CeOBiS$_2$, PrOBiS$_2$, NdOBiS$_2$, LaOBiS$_2$, or SrFBiS$_2$. In some embodiments, the SHE interconnect 222 comprises spin orbit material which includes one of a 2D material or a 3D material, wherein the 3D material is thinner than the 2D material. In some embodiments, the SHE interconnect 222 comprises a spin orbit material which includes materials that exhibit Rashba-Bychkov effect.

In some embodiments, the 2D materials include one or more of: Mo, S, W, Se, Graphene, MoS$_2$, WSe$_2$, WS$_2$, or MoSe$_2$. In some embodiments, the 2D materials include an absorbent which includes one or more of: Cu, Ag, Pt, Bi, Fr, or H absorbents. In some embodiments, the SOC structures comprise a spin orbit material which includes materials that exhibit Rashba-Bychkov effect. In some embodiments, material which includes materials that exhibit Rashba-Bychkov effect comprises materials ROCh$_2$, where 'R' includes one or more of: La, Ce, Pr, Nd, Sr, Sc, Ga, Al, or In, and where "Ch" is a chalcogenide which includes one or more of: S, Se, or Te.

Figure 5A:
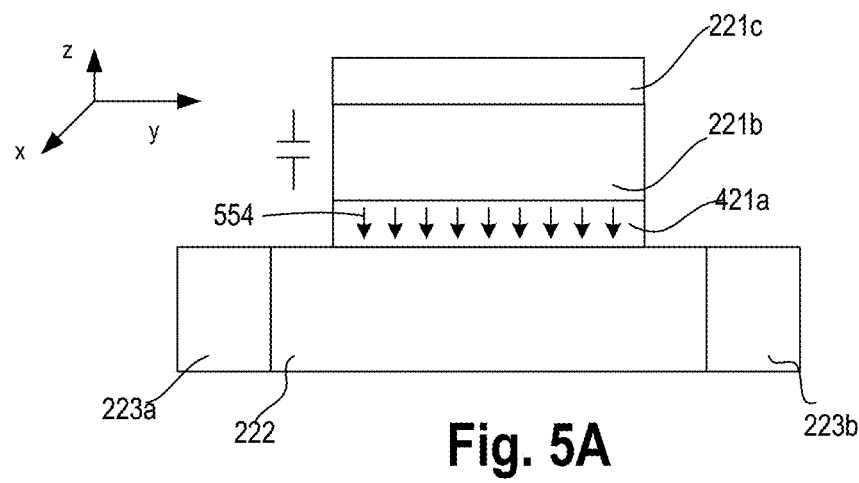
FIGS. 5A-C illustrate a mechanism for switching an out-of-plane multiferroic memory device (e.g. device of FIG. 4A), in accordance with some embodiments.
Figure 5B:
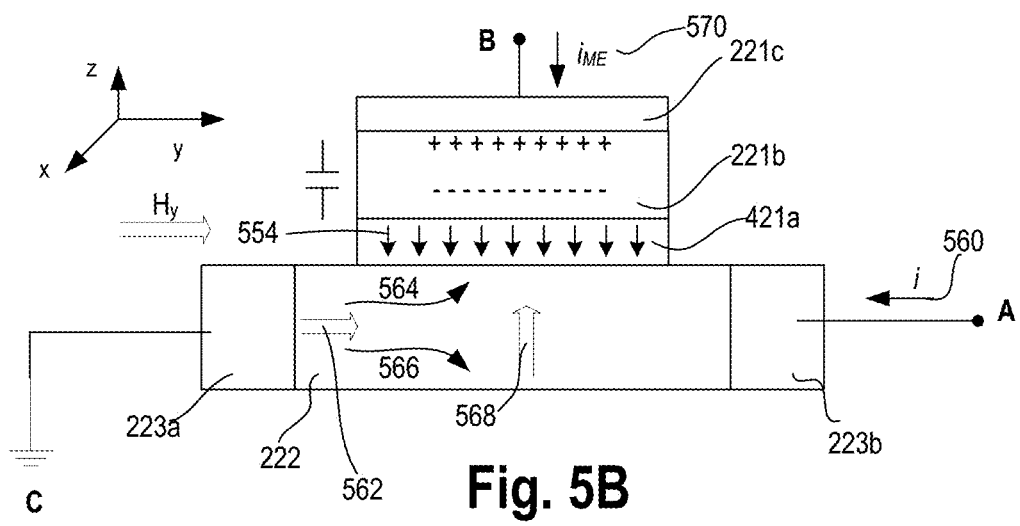
Figure 5C:
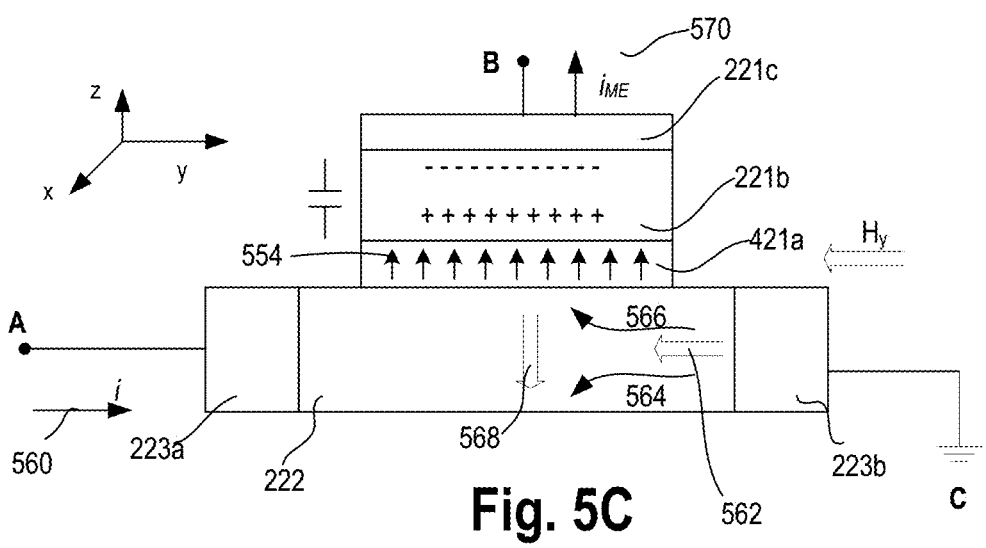

FIGS. 5A-C illustrate a mechanism for switching an out-of-plane Type-II multiferroic memory device (e.g. device of FIG. 4A), in accordance with some embodiments.

FIG. 5A illustrates an out-of-plane Type-II multiferroic memory device, where the out-of-plane Type-II multiferroic 221b and magnet 421a are disposed on a spin orbit torque electrode 222, and where a magnetization 554 of the free magnet 421a (also referred to as storage layer 421a) is perpendicular to the plane of the device. Here, the plane of the device is along the x-y plane, and the magnetization of free magnet can be along +/−z direction. Depending on the direction of the magnetization of magnet 421a, the charge polarity of Type-II multiferroic 221b is determined. This charge polarity is then sensed to determine the logic value stored in the memory device.

FIG. 5B illustrates the SOT memory device switched to a first logic state. In an embodiment, a reversal in the direction of magnetization 554 of the storage layer 421a in FIG. 5B compared to the direction of magnetization 554 of the storage layer 421a is brought about by (a) inducing a spin hall current 568 in the spin orbit torque electrode 222 in the y-direction and (b) by applying a spin torque transfer current 570, i$_{ME}$, (by applying a positive voltage at terminal B with respect to ground C), and/or (c) by applying an external magnetic field, H$_y$, in the y-direction.

In an embodiment, a charge current 560 is passed through the spin orbit torque electrode 222 in the negative y-direction (by applying a positive voltage at terminal A with respect to ground C). In response to the charge current 560, an electron current 562 flows in the positive y-direction. The electron current 560 includes electrons with two opposite spin orientations and experience a spin dependent scattering phenomenon in the spin orbit torque electrode 222.

The electron current 562 includes electrons with two opposing spin orientations, a type I electron 566, having a spin oriented in the negative x-direction and a type II electron 564 having a spin oriented in the positive x-direction. In some embodiments, electrons constituting the electron current 562 experience a spin dependent scattering phenomenon in the spin orbit torque electrode 222. The spin dependent scattering phenomenon is brought about by a spin-orbit interaction between the nucleus of the atoms in the spin orbit torque electrode 222 and the electrons in the electron current 562. The spin dependent scattering phenomenon causes type I electrons 566, whose spins are oriented in the negative x-direction, to be deflected upwards towards an uppermost portion of the spin orbit torque electrode 222 and type II electrons 564 whose spins are oriented in the positive x-direction to be deflected downwards towards a lowermost portion of the spin orbit torque electrode 222.

The separation between the type I electron spin angular moment 566 and the type II electron spin angular moment 564 induces a polarized spin diffusion current 568 in the spin orbit torque electrode 222. In some embodiments, the polarized spin diffusion current 568 is directed upwards toward the free magnet 421a as depicted in FIG. 5B. The polarized spin diffusion current 568 induces a spin hall torque on the magnetization 554 of the free magnet 421a. The spin Hall torque rotates the magnetization 554 to a temporary state pointing in the negative x-direction. In some embodiments, to complete the magnetization reversal process an additional torque is applied. The i$_{ME}$ current 570 flowing through the device exerts an additional torque on the magnetization 554 of the storage layer 421a. The combination of spin Hall torque and spin transfer torque causes flipping of magnetization 554 in the storage layer 421a from the intermediate magnetization state (negative x-direction) to a positive z-direction illustrated in FIG. 5B. In some embodiments, an additional torque can be exerted on the storage layer 421a by applying an external magnetic field, H$_y$, in the y-direction, as illustrated in FIG. 5B, instead of applying an $i_{ME}$ current 570. The magnetization 554 causes the multiferroic material 221b is have a first logic state determined by which portion of the material is more positive than the other.

FIG. 5C illustrates the SOT memory device switched to a second logic state. In an embodiment, a reversal in the direction of magnetization 554 of the storage layer 421a in FIG. 5C compared to the direction of magnetization 554 of the storage layer 421a in FIG. 5B is brought about by (a) reversing the direction of the spin hall current 568 in the spin orbit torque electrode 222 and (b) by reversing the direction of the $i_{ME}$ current 570, and/or (c) by reversing the direction of the external magnetic field, $H_y$. The magnetization 554 is now reversed which causes the multiferroic material 221b is have a second logic state. Compared to the charge polarity of 221b in FIG. 5B, the charge polarity of 221b in FIG. 5C is flipped due to change in magnetization of magnet 421a. The same concept applies when the magnet for the memory device is an in-plane magnet.

Figure 6B:
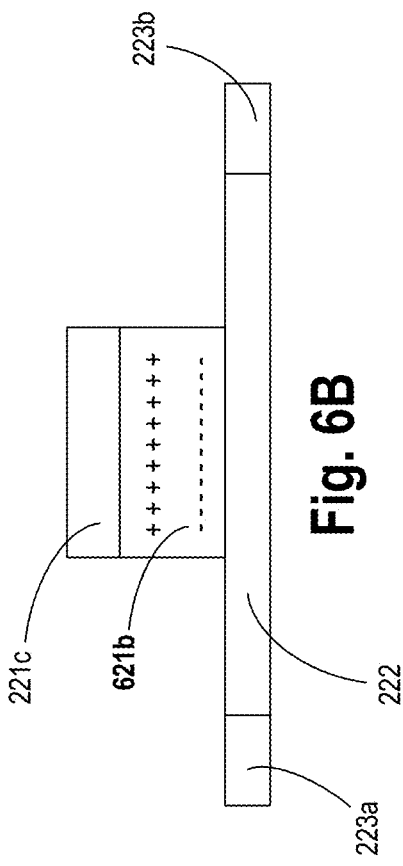

FIG. 6A-B illustrate a 3D view 600 and corresponding top view 620, respectively, of a device having a Type-II multiferroic material directly coupled to a SOC interconnect, in accordance with some embodiments. Compared to the embodiment of FIG. 2A, here, the magnet 221a is removed and the multiferroic material 621b is directly coupled to SOC interconnect 222. In this case, the spin orbit torque generated by the applied current switches the multiferroic material directly. For example, depending on the direction of the applied current through SOC interconnect 222, charge polarity of the multiferroic material 621a changes.

The switching of the polarization of the multiferroic material 621a is read as change in the capacitance across the capacitor formed by SOC 222 and conductor 221c. The sensing of the capacitance can be done using a typical DRAM sense amplifier circuit, in accordance with some embodiments. In some embodiments, the multiferroic material 621 comprises: one or more of: one or more of: Tb, Mn, Ni, V, W, Ca, Co, Rb, Fe, Mo, Cu, Ag, Li, Na, or rare earth metal. In some embodiments, Type-II multiferroic material comprises: $TbMn_2O_5$, $TbMnO_3$, $Ni_3V2O_6$, $MnWO_4$, $Ca_3CoMnO_6$, $RbFe(MoO_4)_3$, $CuFeO_2$ and $ACrO_2$ where A=Cu, Ag, Li, Na; $RMnO_3$ where R is any rare earth metal; and $RMnO_5$ where R is any rare earth metal. Compared to FIGS. 2-5, the multiferroic material is switched directly by SOC interconnect 222. In FIGS. 2-5, magnet 221a switches the multiferroic material.

Figure 7:
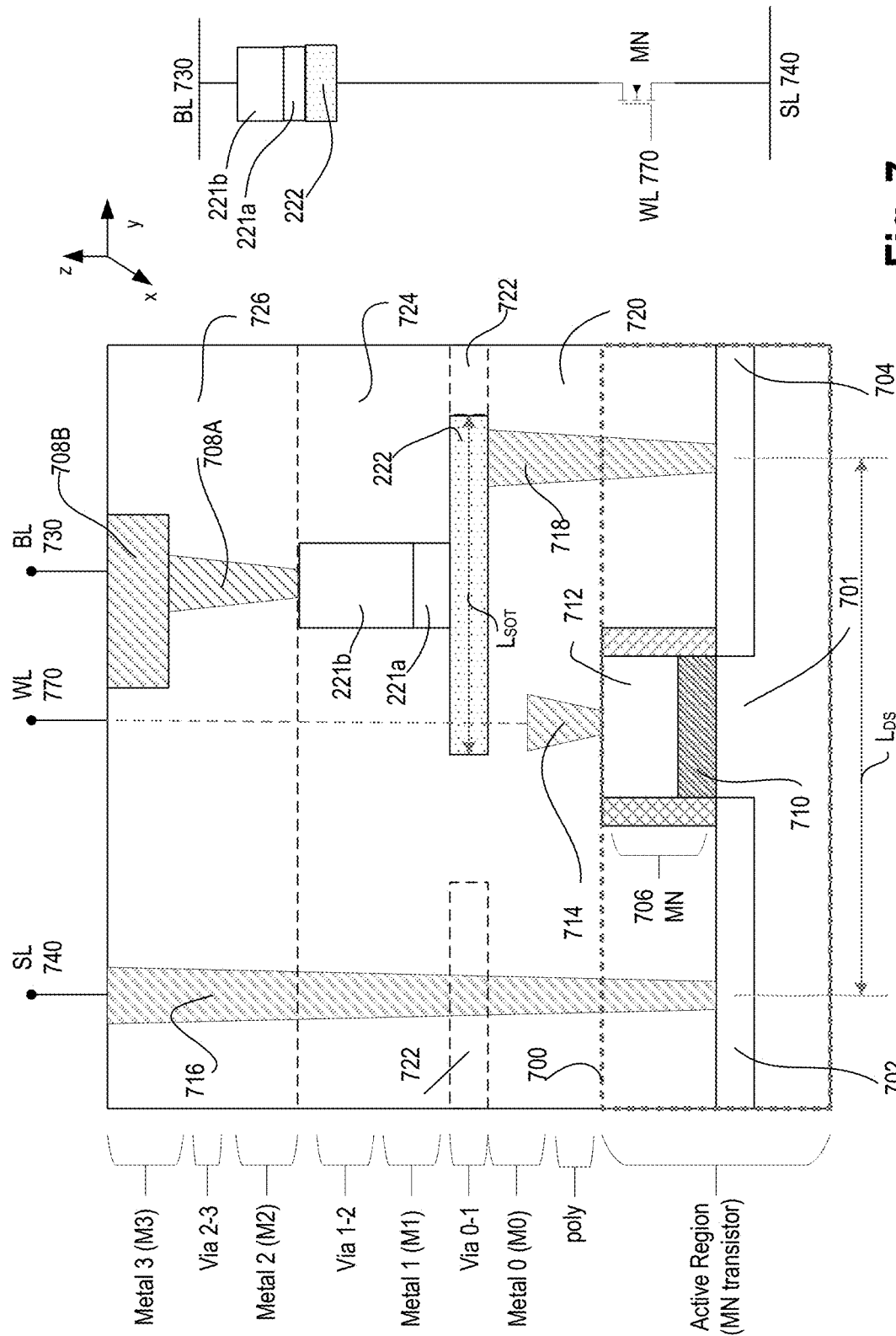
FIG. 7 illustrates a cross-sectional view of a multiferroic memory device (e.g. device of FIG. 4A) coupled to a first transistor and a bit line, according to some embodiments.

FIG. 7 illustrates a cross-sectional view of a Type-II multiferroic memory device (e.g. device of FIG. 4A) coupled to a first transistor and a bit line, according to some embodiments.

In an embodiment, the transistor 700 has a source region 702, a drain region 704 and a gate 706. The transistor 700 (e.g., n-type transistor MN) further includes a gate contact 714 disposed above and electrically coupled to the gate 706, a source contact 716 disposed above and electrically coupled to the source region 702, and a drain contact 718 disposed above and electrically coupled to the drain region 704 as is illustrated in FIG. 7A. In some embodiments, a SOT memory device such as a SOT memory device of FIGS. 2A, 3A, 4A, 6A is disposed above the transistor 700.

In some embodiments, the SOT memory device of FIGS. 2A, 3A, 4A, 6A includes a spin orbit torque electrode, such as spin orbit torque electrode 222, a multiferroic material (221b or 621b) disposed on the spin orbit torque electrode 222, and a conductive interconnect structure such as conductive interconnect structure 708 (e.g., structure 708A/B) disposed on and coupled to the multiferroic material (221b or 621b). In some embodiments, the spin orbit torque electrode 222 is disposed on the drain contact 718 of the transistor 700.

In some embodiments, the memory device of FIGS. 2A, 3A, 4A, 6A includes individual functional layers that are described in association with various embodiments. In some embodiments, the spin orbit torque electrode 222 has a length, $L_{SOT}$ that is less than a distance of separation, $L_{DS}$ between the drain contact 718 and the source contact 716. In some embodiments, a portion of the spin orbit torque electrode 222 extends above the gate electrode 712 and the gate contact 714. In some embodiments, a portion of the spin orbit torque electrode 222 extends over the gate electrode 712. In some embodiments, the spin orbit torque electrode 222 is in a first y-z plane as illustrated in FIG. 5A.

In some embodiments, the gate contact 714 is directly below the spin orbit torque electrode 222. In some embodiments, a word-line (WL) contact is disposed onto the gate contact 714 on a second y-z plane behind (into the page) the first y-z plane of the spin orbit torque electrode 222. In some embodiments, the spin orbit torque electrode 222 that may not contact the word-line contact is disposed on the gate electrode 712.

In some embodiments, transistor 700 associated with substrate 701 is a metal-oxide-semiconductor field-effect transistor (MOSFET or simply MOS transistors), fabricated on the substrate 701. In various embodiments of the present disclosure, the transistor 700 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. In an embodiment, the transistor 700 is a tri-gate transistor.

In some embodiments, a voltage $V_{DS}$ is applied between the bit-line (BL) 730 and the source-line (SL) 740 and a word-line 750 is energized above a threshold voltage, $V_{TH}$ on the transistor 700. In some embodiments, an electron current (spin hall current) flows through the spin orbit torque electrode 222 and causes a spin diffusion current to flow toward the memory device of FIGS. 2A, 3A, 4A, 6A. The spin diffusion current exerts a torque on the magnetization of the free magnet 421a.

In some embodiments, by applying a voltage $V_{DS}$ between bit-line 730 and source-line 740, current can flow through the memory device of FIGS. 2A, 3A, 4A, 6A. In some embodiments, a voltage $V_{DS}$ that is equal to or greater than the threshold voltage $V_{TS}$ is enough to generate spin polarized current through the memory device of FIGS. 2A, 3A, 4A, 6A. In some embodiments, the spin transfer torque current flowing through the memory device of FIGS. 2A, 3A, 4A, 6A also imparts torque to the free magnet 421a adding to the torque from the spin diffusion current. In some embodiments, the combined effect of the spin transfer torque and the spin diffusion torque can switch the magnetization of the free magnet 421a. In some embodiments, by reversing the polarity of the voltage $V_{DS}$, and applying a voltage that meets or exceeds a threshold voltage, the direction of magnetization of the free magnet 421a is switched back to a previous configuration.

In some embodiments, by applying a voltage between a bit-line 730 and source-line 740, and by applying a voltage above a threshold voltage, $V_{TH}$ on the word-line 770 of the transistor 700, the memory device of FIGS. 2A, 3A, 4A, 6A can undergo magnetization switching without the need for an additional voltage source (e.g. a second transistor). In some embodiments, implementing a SOT memory device above a transistor can increase the number of SOT memory devices in a given area of a die by at least a factor of two.

In some embodiments, the underlying substrate 701 represents a surface used to manufacture integrated circuits. In some embodiments, the substrate 701 includes a suitable semiconductor material such as but not limited to, single crystal silicon, polycrystalline silicon and silicon on insulator (SOI). In another embodiment, the substrate 701 includes other semiconductor materials such as germanium, silicon germanium, or a suitable group III-V or group III-N compound. The substrate 701 may also include semiconductor materials, metals, dopants, and other materials commonly found in semiconductor substrates.

In some embodiments, the transistor 700 includes a gate stack formed of at least two layers, a gate dielectric layer 710 and a gate electrode layer 712. The gate dielectric layer 710 may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 710 to improve its quality when a high-k material is used.

The gate electrode layer 712 of the transistor 700 is formed on the gate dielectric layer 710 and may comprise of at least one P-type work-function metal or N-type work-function metal, depending on whether the transistor is to be a PMOS or an NMOS transistor. In some embodiments, the gate electrode layer 712 may comprise of a stack of two or more metal layers, where one or more metal layers are work-function metal layers and at least one metal layer is a conductive fill layer.

For a PMOS transistor, metals that may be used for the gate electrode layer 712 include, but are not limited to, ruthenium, palladium, platinum, cobalt, nickel, and conductive metal oxides, e.g., ruthenium oxide. A P-type metal layer will enable the formation of a PMOS gate electrode layer 712 with a work-function that is between about 4.9 eV and about 5.2 eV. For an NMOS transistor, metals that may be used for the gate electrode layer 512 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode layer 712 with a work-function that is between about 3.9 eV and about 4.2 eV.

In some embodiments, the gate electrode layer 712 may comprise a "U"-shaped structure that includes a bottom portion substantially parallel to the surface of the substrate and two sidewall portions that are substantially perpendicular to the top surface of the substrate. In another embodiment, at least one of the metal layers that form the gate electrode layer 712 may simply be a planar layer that is substantially parallel to the top surface of the substrate and does not include sidewall portions substantially perpendicular to the top surface of the substrate. In some embodiments of the present disclosure, the gate electrode layer 712 may comprise of a combination of U-shaped structures and planar, non-U-shaped structures. For example, the gate electrode layer 712 may comprise of one or more U-shaped metal layers formed atop one or more planar, non-U-shaped layers.

In some embodiments, a pair of gate dielectric layer 710 may be formed on opposing sides of the gate stack that bracket the gate stack. The gate dielectric layer 710 may be formed from a material such as silicon nitride, silicon oxide, silicon carbide, silicon nitride doped with carbon, and silicon oxynitride. Processes for forming sidewall spacers are well known in the art and generally include deposition and etching process operations. In some embodiments, a plurality of spacer pairs may be used, for instance, two pairs, three pairs, or four pairs of sidewall spacers may be formed on opposing sides of the gate stack.

In some embodiments, source region 702 and drain region 704 are formed within the substrate adjacent to the gate stack of the transistor 700. The source region 702 and drain region 704 are generally formed using either an implantation/diffusion process or an etching/deposition process. In the former process, dopants such as boron, aluminum, antimony, phosphorous, or arsenic may be ion-implanted into the substrate to form the source region 702 and drain region 704. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source region 702 and drain region 704. In some embodiments, the source region 702 and drain region 704 may be fabricated using a silicon alloy such as silicon germanium or silicon carbide. In some embodiments, the epitaxially deposited silicon alloy may be doped in-situ with dopants such as boron, arsenic, or phosphorous. In some embodiments, the source region 702 and drain region 704 may be formed using one or more alternate semiconductor materials such as germanium or a suitable group III-V compound. In some embodiments, one or more layers of metal and/or metal alloys may be used to form the source region 702 and drain region 704.

In some embodiments, the gate contact 714 and drain contact 718 of the transistor 700 are disposed in a first dielectric layer 720 disposed above the substrate 501. In some embodiments, the spin orbit torque electrode 222 is disposed in a second dielectric layer 722 disposed on the first dielectric layer 720. In some embodiments, a third dielectric layer 724 is disposed on the second dielectric layer 722. In some embodiments, a fourth dielectric layer 726 is disposed on the third dielectric layer 724. In some embodiments, a source contact 716 is partially disposed in the fourth dielectric layer 726, partially disposed in the third dielectric layer 724, partially disposed in the second dielectric layer 722 and partially disposed on the first dielectric layer 720. In some embodiments, the spin orbit torque electrode contact is disposed in the third dielectric layer 724 on the spin orbit torque electrode 222. In some embodiments, the conductive interconnect structure such as conductive interconnect structure 708a/b disposed in the fourth dielectric layer 726.

In the illustrated embodiment of FIG. 5A, the gate contract 714 is formed in poly region; drain contract 718 is formed in active, poly, and Metal 0 (M0); SOT or SHE electrode 222 is formed in Via 0-1 layer; structures 221a and 221c (or 621b) is formed in Metal 1 (M1) and Via 1-2;

contract 708a is formed in Metal 2 (M2) and Via 2-3; and conductor 708B is formed in Metal 3 (M3).

In some embodiments, structures 421a and 221b (or 621b) are formed in the metal 3 (M3) region. In some embodiments, the free magnet layer 421a couples to spin Hall electrode 222. In some embodiments, the multiferroic material 221b or 621b couples to the bit-line (BL) via spin Hall electrode 222 through Via 3-4 (e.g., via connecting metal 4 region to metal 4 (M4)). In this example embodiments, the bit-line is formed on M4.

In some embodiments, an n-type transistor MN is formed in the frontend of the die while the spin Hall electrode 222 is located in the backend of the die. Here, the term "backend" generally refers to a section of a die which is opposite of a "frontend" and where an IC (integrated circuit) package couples to IC die bumps. For example, high level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example). In some embodiments, the spin Hall electrode 222 is located in the backend metal layers or via layers for example in Via 3. In some embodiments, the electrical connectivity to the device is obtained in layers M0 and M4 or M1 and M5 or any set of two parallel interconnects. In some embodiments, structures 221a and 221b (or 621b) are formed in metal 2 (M2) and metal 1 (M1) layer region and/or Via 1-2 region. In some embodiments, the spin Hall electrode 222 is formed in the metal 1 region.

While the embodiment of FIG. 7 is illustrated for memory device of FIG. 4, it is also applicable to memory devices of other embodiments of the disclosure (e.g., embodiments of FIG. 2A, FIG. 3A, and FIG. 6A).

Figure 8:
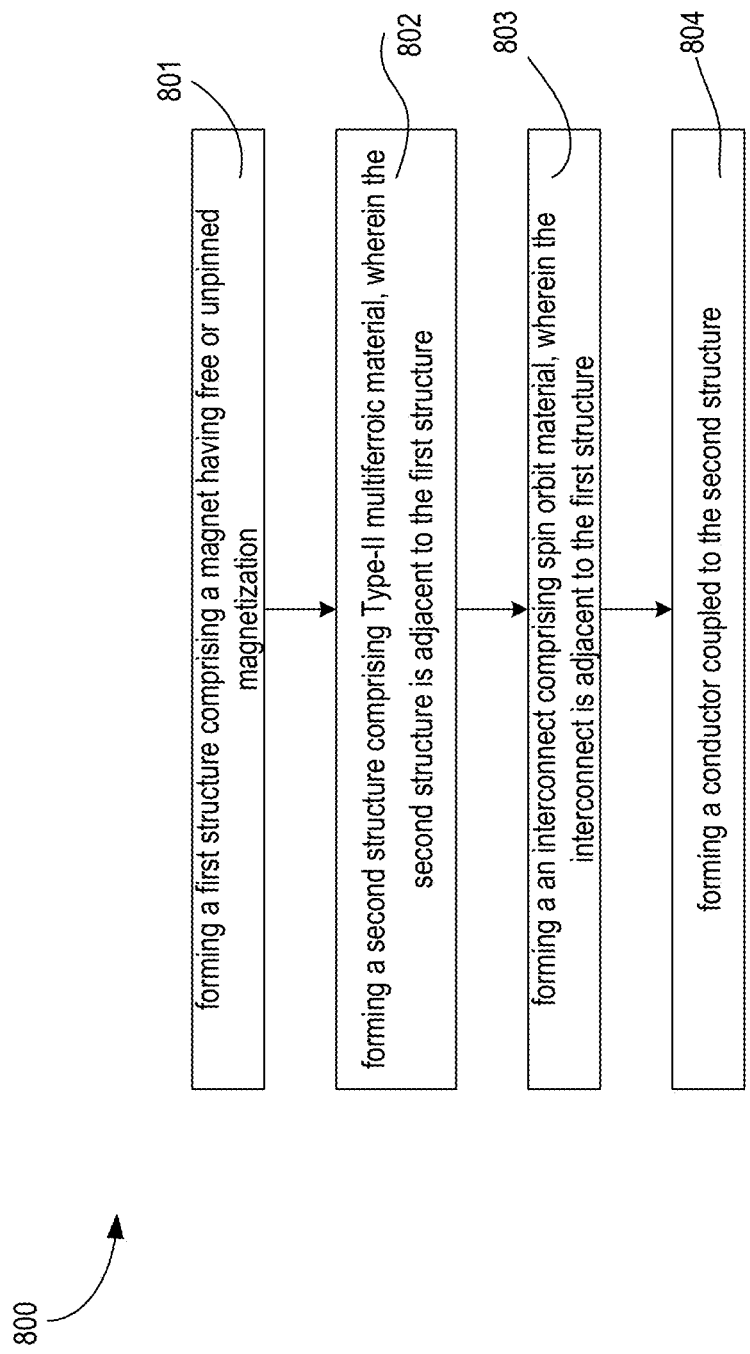
FIG. 8 illustrates a flowchart of a method for forming a multiferroic memory device (e.g. device of FIG. 4A), according to some embodiments of the disclosure.

FIG. 8 illustrates a flowchart 800 of a method for forming a Type-II multiferroic memory device (e.g. device of FIG. 4A), according to some embodiments of the disclosure. While various blocks of flowchart 800 are shown in a particular order, the order can be changed. For example, some blocks can be performed before others and some blocks can be performed simultaneously with others.

At block 801, a first structure is formed comprising a magnet 421a having free or unpinned magnetization. In some embodiments, the magnet 421a has perpendicular magnetization relative to a plane of a device. In some embodiments, the magnet 421a has perpendicular magnetization relative to a plane of a device. In some embodiments, the magnet is one of a paramagnet or ferromagnet.

At block 802, a second structure is formed comprising Type-II multiferroic material 221b, wherein the second structure is adjacent to the first structure. In some embodiments, the Type-II multiferroic material comprises one or more of: Tb, Mn, Ni, V, W, Ca, Co, Rb, Fe, Mo, Cu, Ag, Li, Na, or rare earth metal.

At block 803, an interconnect 222 is formed comprising spin orbit material, wherein the interconnect is adjacent to the first structure. In some embodiments, the spin orbit material includes one or more of: β-Tantalum (β-Ta), Ta, β-Tungsten (β-W), W, Platinum (Pt), Copper (Cu) doped with elements including on of Iridium, Bismuth or elements of 3d, 4d, 5d and 4f, 5f periodic groups, Ti, S, W, Mo, Se, B, Sb, Re, La, C, P, La, As, Sc, O, Bi, Ga, Al, Y, In, Ce, Pr, Nd, F, Ir, Mn, Pd, or Fe. In some embodiments, the spin orbit material includes one of: a 2D material, a 3D material, an antiferromagnetic (AFM) material, or an AFM material doped with a doping material; the 3D material is thinner than the 2D material; or the doping material includes one of: Co, Fe, Ni, Mn, Ga, Fe, or Bct-Ru.

At block 804, a conductor 221c is formed and coupled to the second structure. In some embodiments, the conductor comprises a material which includes one or more of: Cu, Ag, Al, Au, Co, W, Ta, Ni, or graphene.

Figure 9:
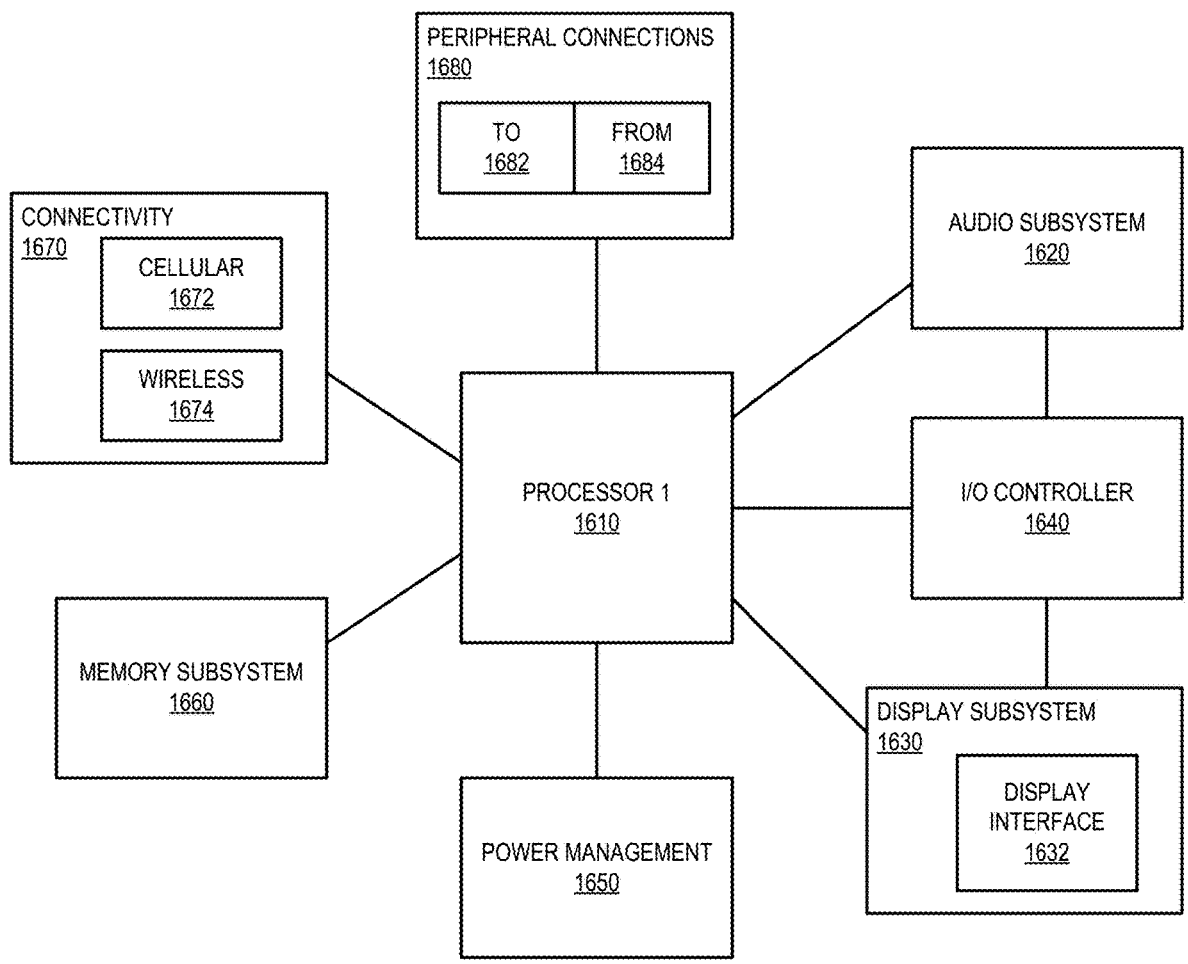
FIG. 9 illustrates a smart device or a computer system or a SoC (System-on-Chip) with multiferroic memory device, according to some embodiments.

FIG. 9 illustrates a smart device or a computer system or a SoC (System-on-Chip) with Type-II multiferroic memory device, according to some embodiments. FIG. 9 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with Type-II multiferroic memory device, according to some embodiments discussed. Other blocks of the computing device 1600 may also include Type-II multiferroic memory device, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. The various examples of embodiments can be combined in any suitable manner.

Example 1

An apparatus comprising: a first structure comprising a magnet having free or unpinned magnetization; a second structure comprising Type-II multiferroic material, wherein the second structure is adjacent to the first structure; and an interconnect comprising spin orbit material, wherein the interconnect is adjacent to the first structure.

Example 2

The apparatus of example 1, wherein the Type-II multiferroic material comprises one or more of: Tb, Mn, Ni, V, W, Ca, Co, Rb, Fe, Mo, Cu, Ag, Li, Na, or rare earth metal.

Example 3

The apparatus of example 1, wherein the magnet has perpendicular magnetization relative to a plane of a device.

Example 4

The apparatus of example 1, wherein the magnet is one of a paramagnet or ferromagnet.

Example 5

The apparatus of example 1, wherein the magnet comprises a material which includes one or more of: Pt, Pd, W, Ce, Al, Li, Mg, Na, Cr, O, Co, Dy, Er, Eu, Gd, Fe, Nd, K, Pr, Sm, Tb, Tm, or V.

Example 6

The apparatus of example 1, wherein the magnet comprises one or a combination of materials which includes one or more of: a Heusler alloy, Co, Fe, Ni, Gd, B, Ge, Ga, permalloy, or Yttrium Iron Garnet (YIG), and wherein the Heusler alloy is a material which includes one or more of: Cu, Mn, Al, In, Sn, Ni, Sb, Ga, Co, Fe, Si, Pd, Sb, Si, V, or Ru.

Example 7

The apparatus of example 1, wherein the spin orbit material includes one or more of: β-Tantalum (β-Ta), Ta, β-Tungsten 03-W), W, Platinum (Pt), Copper (Cu) doped with elements including on of Iridium, Bismuth or elements of 3d, 4d, 5d and 4f, 5f periodic groups, Ti, S, W, Mo, Se, B, Sb, Re, La, C, P, La, As, Sc, O, Bi, Ga, Al, Y, In, Ce, Pr, Nd, F, Ir, Mn, Pd, or Fe.

Example 8

The apparatus of example 1, wherein: the spin orbit material includes one of: a 2D material, a 3D material, an antiferromagnetic (AFM) material, or an AFM material doped with a doping material; the 3D material is thinner than the 2D material; or the doping material includes one of: Co, Fe, Ni, Mn, Ga, Fe, or Bct-Ru.

Example 9

The apparatus of example 8, wherein the 2D material includes one or more of: Bi, Se, Te, Se, Sb, W, Te, Pt, Mo, or S.

Example 10

The apparatus of example 8, wherein the AFM material includes one of: Ir, Pt, Mn, Pd, or Fe.

Example 11

The apparatus of example 8, wherein the AFM material is a quasi-two-dimensional triangular AFM including $Ni_{(1-x)}M_xGa_2S_4$, where 'M' includes one of: Mn, Fe, Co or Zn.

Example 12

The apparatus of example 1, wherein the interconnect comprises a chiral antiferromagnetic material which includes Mn and one or more: Ge, Sn Fa, Ir, Rh, or Pt.

Example 13

The apparatus of example 1, comprises a conductor coupled to the second structure, wherein the conductor comprises a material which includes one or more of: Cu, Ag, Al, Au, Co, W, Ta, Ni, or graphene.

Example 14

An apparatus comprising: a conductor; a structure comprising Type-II multiferroic material, wherein the structure is adjacent to the conductor; and an interconnect comprising spin orbit material, wherein the interconnect is adjacent to the structure.

Example 15

The apparatus of example 14, wherein the Type-II multiferroic material comprises one or more of: Tb, Mn, Ni, V, W, Ca, Co, Rb, Fe, Mo, Cu, Ag, Li, Na, or rare earth metal.

Example 16

The apparatus of example 14, comprises a conductor coupled to the second structure, wherein the conductor comprises a material which includes one or more of: Cu, Ag, Al, Au, Co, W, Ta, Ni, or graphene.

Example 17

The apparatus of example 14, wherein the spin orbit material includes one or more of: β-Tantalum (β-Ta), Ta, β-Tungsten (β-W), W, Platinum (Pt), Copper (Cu) doped with elements including on of Iridium, Bismuth or elements of 3d, 4d, 5d and 4f, 5f periodic groups, Ti, S, W, Mo, Se, B, Sb, Re, La, C, P, La, As, Sc, O, Bi, Ga, Al, Y, In, Ce, Pr, Nd, F, Ir, Mn, Pd, or Fe.

Example 18

The apparatus of example 14, wherein: the spin orbit material includes one of: a 2D material, a 3D material, an antiferromagnetic (AFM) material, or an AFM material doped with a doping material; the 3D material is thinner than the 2D material; or the doping material includes one of: Co, Fe, Ni, Mn, Ga, Fe, or Bct-Ru.

Example 19

A system comprising: a processor; a memory coupled to the processor, wherein the memory comprises: a first structure comprising a magnet having free or unpinned magnetization; a second structure comprising Type-II multiferroic material, wherein the second structure is adjacent to the first structure; and an interconnect comprising spin orbit material, wherein the interconnect is adjacent to the first structure; and a wireless interface to allow the processor to communicate with another device.

Example 20

The system of example 19, wherein the Type-II multiferroic material comprises one or more of: Tb, Mn, Ni, V, W, Ca, Co, Rb, Fe, Mo, Cu, Ag, Li, Na, or rare earth metal.

The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first structure comprising a magnet having free or unpinned magnetization;
a second structure comprising Type-II multiferroic material, wherein the second structure is adjacent to the first structure; and
an interconnect comprising spin orbit material, wherein the interconnect is adjacent to the first structure.

2. The apparatus of claim 1, wherein the Type-II multiferroic material which comprises one or more of Tb, Mn, Ni, V, W, Ca, Co, Rb, Fe, Mo, Cu, Ag, Li, Na, or a rare earth metal.

3. The apparatus of claim 1, wherein the magnet has perpendicular magnetization relative to a plane of a device.

4. The apparatus of claim 1, wherein the magnet is one of a paramagnet or a ferromagnet.

5. The apparatus of claim 1, wherein the magnet comprises one or more of Pt, Pd, W, Ce, Al, Li, Mg, Na, Cr, O, Co, Dy, Er, Eu, Gd, Fe, Nd, K, Pr, Sm, Tb, Tm, or V.

6. The apparatus of claim 1, wherein the magnet comprises one or a combination of one or more of a Heusler alloy, Co, Fe, Ni, Gd, B, Ge, Ga, permalloy, or Yttrium Iron Garnet (YIG), and wherein the Heusler alloy comprises one or more of Cu, Mn, Al, In, Sn, Ni, Sb, Ga, Co, Fe, Si, Pd, Sb, Si, V, or Ru.

7. The apparatus of claim 1, wherein the spin orbit material comprises one or more of β-Tantalum (β-Ta), Ta, β-Tungsten (β-W), W, Platinum (Pt), Copper (Cu) doped with elements comprising one or more of Iridium, Bismuth or elements of 3d, 4d, 5d and 4f, 5f periodic groups, Ti, S, W, Mo, Se, B, Sb, Re, La, C, P, La, As, Sc, O, Bi, Ga, Al, Y, In, Ce, Pr, Nd, F, Ir, Mn, Pd, or Fe.

8. The apparatus of claim 1, wherein the spin orbit material comprises one of a 2D material, a 3D material, or an antiferromagnetic (AFM) material.

9. The apparatus of claim 8, wherein the spin orbit material comprises the 2D material, the 2D material comprising one or more of Bi, Se, Te, Se, Sb, W, Pt, Mo, or S.

10. The apparatus of claim 8, wherein the spin orbit material comprises the AFM material, the AFM material comprising one of Ir, Pt, Mn, Pd, or Fe.

11. The apparatus of claim 8, wherein the spin orbit material comprises the AFM material, the AFM material comprising a quasi-two-dimensional triangular AFM comprising $Ni_{(1-x)}M_xGa_2S_4$, where 'M' comprises one of Mn, Fe, Co or Zn.

12. The apparatus of claim 1, wherein the interconnect comprises a chiral antiferromagnetic material comprising Mn and one or more of Ge, Sn Fa, Ir, Rh, or Pt.

13. The apparatus of claim 1, further comprising a conductor coupled to the second structure, wherein the conductor comprises one or more of Cu, Ag, Al, Au, Co, W, Ta, Ni, or graphene.

14. An apparatus comprising:
a conductor;
a structure comprising Type-II multiferroic material, wherein the structure is adjacent to the conductor; and
an interconnect comprising spin orbit material, wherein the interconnect is adjacent to the structure.

15. The apparatus of claim 14, wherein the Type-II multiferroic material comprises one or more of Tb, Mn, Ni, V, W, Ca, Co, Rb, Fe, Mo, Cu, Ag, Li, Na, or a rare earth metal.

16. The apparatus of claim 14, wherein the conductor comprises one or more of Cu, Ag, Al, Au, Co, W, Ta, Ni, or graphene.

17. The apparatus of claim 14, wherein the spin orbit material comprises one or more of β-Tantalum (β-Ta), Ta, β-Tungsten (β-W), W, Platinum (Pt), Copper (Cu) doped with elements comprising one or more of Iridium, Bismuth or elements of 3d, 4d, 5d and 4f, 5f periodic groups, Ti, S, W, Mo, Se, B, Sb, Re, La, C, P, La, As, Sc, O, Bi, Ga, Al, Y, In, Ce, Pr, Nd, F, Jr, Mn, Pd, or Fe.

18. The apparatus of claim 14, wherein the spin orbit material comprises one of a 2D material, a 3D material, or an antiferromagnetic (AFM) material.

19. A system comprising:
a processor;

a memory coupled to the processor, wherein the memory comprises:
- a first structure comprising a magnet having free or unpinned magnetization;
- a second structure comprising Type-II multiferroic material, wherein the second structure is adjacent to the first structure; and
- an interconnect comprising spin orbit material, wherein the interconnect is adjacent to the first structure; and a wireless interface to allow the processor to communicate with another device.

20. The system of claim 19, wherein the Type-II multiferroic material comprises one or more of Tb, Mn, Ni, V, W, Ca, Co, Rb, Fe, Mo, Cu, Ag, Li, Na, or a rare earth metal.

21. A system comprising:
a processor;
a memory coupled to the processor, wherein the memory comprises:
- a structure comprising Type-II multiferroic material, wherein the structure is adjacent to the conductor; and
- an interconnect comprising spin orbit material, wherein the interconnect is adjacent to the structure; and a wireless interface to allow the processor to communicate with another device.

22. The system of claim 21, wherein the Type-II multiferroic material comprises one or more of Tb, Mn, Ni, V, W, Ca, Co, Rb, Fe, Mo, Cu, Ag, Li, Na, or a rare earth metal.

* * * * *